(12) United States Patent
Fukatsu et al.

(10) Patent No.: US 6,528,870 B2
(45) Date of Patent: Mar. 4, 2003

(54) SEMICONDUCTOR DEVICE HAVING A PLURALITY OF STACKED WIRING BOARDS

(75) Inventors: Kenta Fukatsu, Fujisawa (JP); Yasuhito Saito, Yokohama (JP); Masayuki Arakawa, Yokohama (JP); Tomohiro Iguchi, Yokohama (JP); Naotake Watanabe, Yokohama (JP); Yoshitoshi Fukuchi, Yokohama (JP); Tetsuro Komatsu, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/769,394

(22) Filed: Jan. 26, 2001

(65) Prior Publication Data

US 2001/0028104 A1 Oct. 11, 2001

(30) Foreign Application Priority Data

Jan. 28, 2000 (JP) .......................... 2000-020292
May 30, 2000 (JP) .......................... 2000-160190

(51) Int. Cl.⁷ .............................................. H01L 23/02
(52) U.S. Cl. .................. 257/685; 257/686; 257/695; 257/723; 257/737; 257/777; 257/778; 257/780
(58) Field of Search ................................. 257/685, 686, 257/698, 723, 777, 778, 780, 737

(56) References Cited

U.S. PATENT DOCUMENTS

| 5,471,151 A | * | 11/1995 | DiFrancesco ............... 324/757 |
| 6,188,127 B1 | * | 2/2001 | Senba et al. ................. 257/686 |
| 6,239,496 B1 | * | 5/2001 | Asada ........................... 257/777 |
| 6,246,010 B1 | * | 6/2001 | Zenner et al. ............... 174/260 |

* cited by examiner

*Primary Examiner*—Eddie Lee
*Assistant Examiner*—Matthew E. Warren
(74) *Attorney, Agent, or Firm*—Oblon, Spivak, McClelland, Maier & Neustadt, P.C.

(57) ABSTRACT

In a stacked-type semiconductor unit having a plurality of semiconductor devices stacked on a base board including a base electrode, each semiconductor device has a wiring board including an external electrode provided in an end portion thereof. The semiconductor devices are stacked on the base board such that the external electrodes are aligned with one another. Then, the external electrodes are electrically connected to the base board by solder.

9 Claims, 18 Drawing Sheets

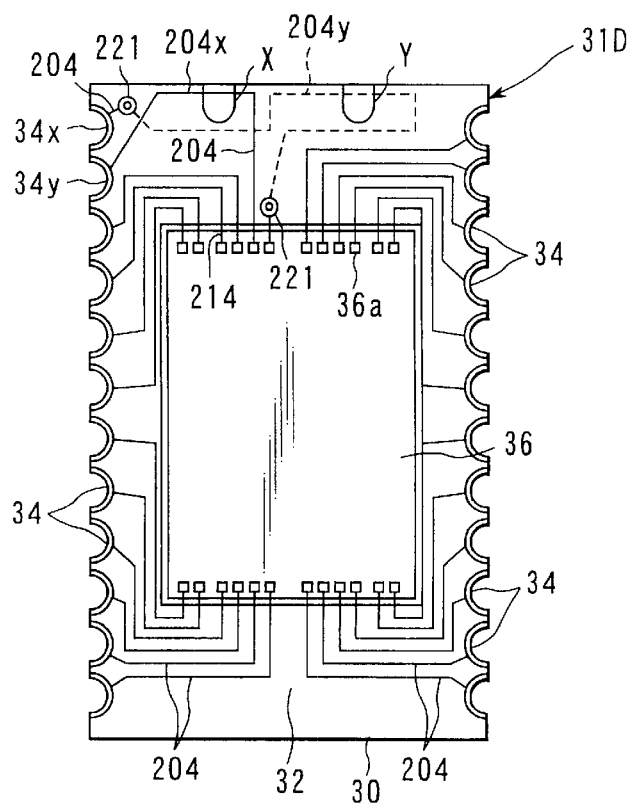
FIG. 21
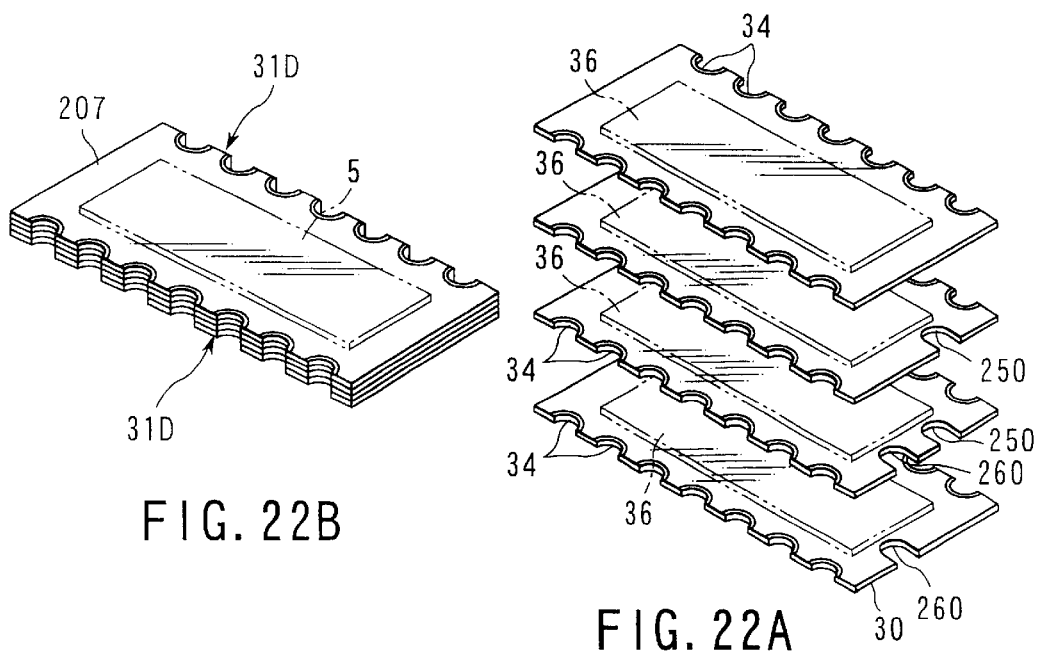
FIG. 22B
FIG. 22A

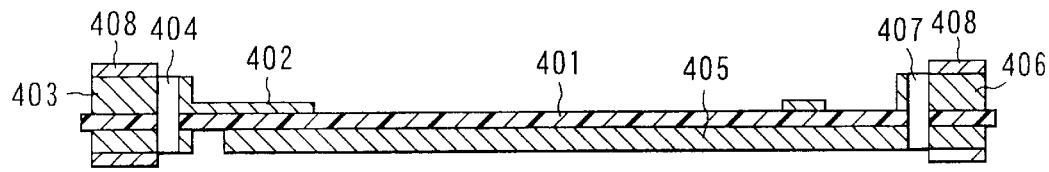
F I G. 25A
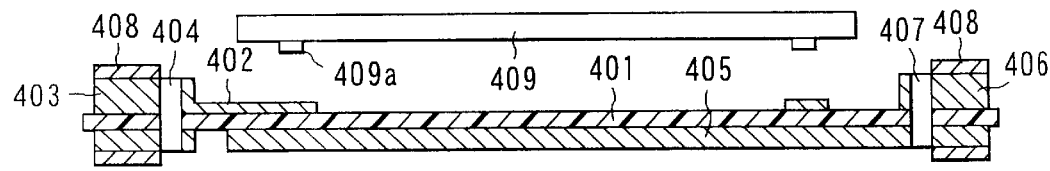
F I G. 25B
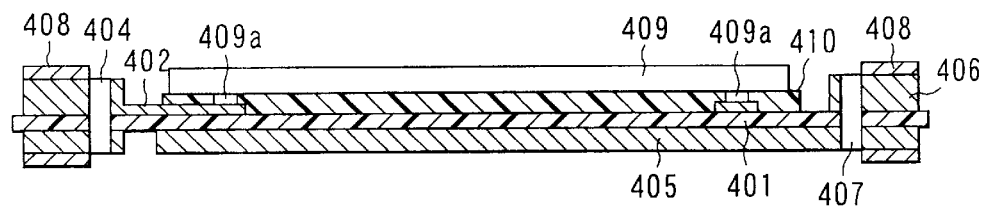
F I G. 25C
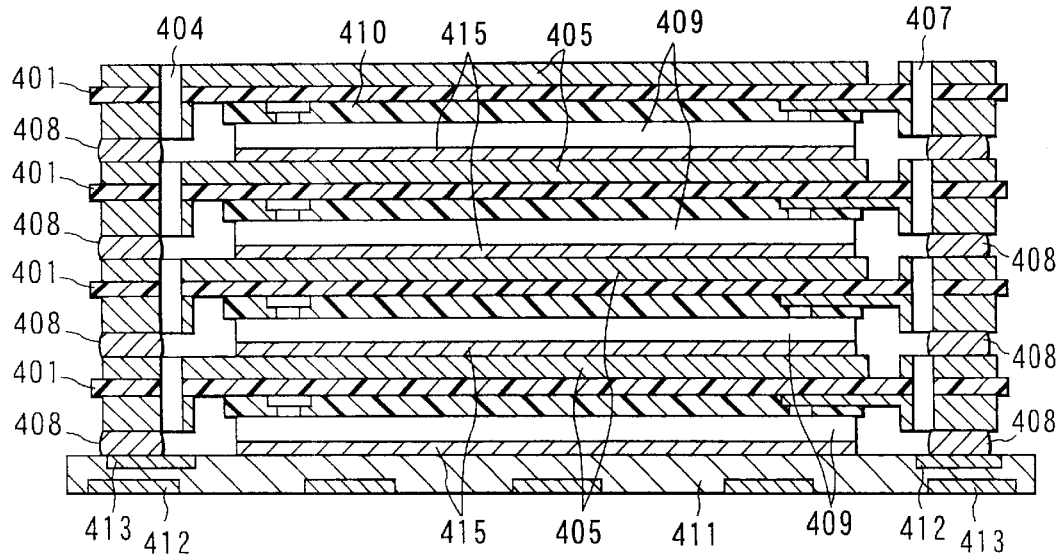
F I G. 26

SEMICONDUCTOR DEVICE HAVING A PLURALITY OF STACKED WIRING BOARDS

CROSS-REFERENCE TO RELATED APPLICATIONS

This application is based upon and claims the benefit of priority from the prior Japanese Patent Applications No. 2000-020292, filed Jan. 28, 2000; and No. 2000-160190, filed May 30, 2000, the entire contents of which are incorporated herein by reference.

BACKGROUND OF THE INVENTION

The present invention relates to a semiconductor device incorporating a semiconductor chip mounted on a wiring board, a stacked-type semiconductor unit having a plurality of semiconductor devices stacked on a base board, and a method for manufacturing the same.

In recent years, a small memory card on which a flash memory is mounted is utilized in portable information equipment, for example, a digital still camera or a portable information terminal. The market of such a memory card has rapidly been expanded. In particular, the memory cards have been dominating in the field of the digital camera, and will supersede MDs (Mini Disks) and floppy disks.

With the above situation as a background, it is required that a small memory card including only flash memories be larger in capacity, smaller in size and weight, and lower in cost. For this purpose, various package structures and mount structures of a memory IC have been considered.

In general, a thin mold package, such as a TSOP (Thin Small Outline Package), is soldered to a base board, or a bare chip is directly connected to a base board by means of wire bonding or flip-chip bonding. Since the capacity of the given area is determined by a chip size, in order to increase the capacity, a stacked-type semiconductor unit has been required. This type of semiconductor device has a mount structure in which chips are stacked three-dimensionally in order to the overall size of the device or the pitch of the chips.

FIG. 29 shows a conventional stacked-type semiconductor unit. The stacked-type semiconductor unit has a plurality of, for example, four semiconductor devices 20 stacked one on another. Each semiconductor device 20 has a wiring board 24 including a sheet-like holding member 21 made of polyimid or the like and a wiring pattern 22 formed thereon. Bumps 23 made of gold or the like are formed on the wiring pattern 22. A semiconductor chip 1 is mounted on the bumps 23 by flip-chip bonding. The semiconductor chip 1 is sealed with resin 7, such as epoxy, and packaged.

The four semiconductor devices 20 each formed by packaging the semiconductor chip 1 are stacked and mounted on desired connecting lands 8 on a base board 3 via solders 25, for example, solder balls. Each solder 25 is provided on an electrode 26 formed in an end portion of the wiring board 24.

The solders 25 are formed on the electrodes 26 on the wiring board 24 by providing a solder ball or printing solder paste on the electrodes 26. In either case, to firmly and stably connect the stacked wiring boards 24, i.e., the semiconductor device 20, to the base board 3 by the solders 25, it is necessary to supply the solders 25 on the electrodes 26, and thereafter to put the stacked four wiring boards 24 into a reflowing furnace, so that the solders 25 can be melted and fixed to the electrodes 26.

However, when a plurality of semiconductor devices 20 are put in the reflowing furnace to fix the solders 25, the wiring boards 24 may be warped by the influence of heat in the furnace. In addition, the connecting portion between the semiconductor chip 1 and the wiring pattern 22 may be damaged. As a result, defectives may exist in the semiconductor devices 20, resulting in the decrease in manufacturing yield. Moreover, it is difficult to manage the process.

BRIEF SUMMARY OF THE INVENTION

An object of the present invention is to provide a semiconductor device, a stacked-type semiconductor unit, which can be manufactured by a simple process and the quality of which can be stable, and a method for manufacturing the same.

According to a first aspect of the present invention, there is provided a semiconductor device comprising:
  a semiconductor chip having flexibility and including an internal electrode;
  a wiring board having flexibility and including a wiring pattern electrically connected to the internal electrode of the semiconductor chip; and
  an external electrode provided in an end portion of the wiring board and electrically connected to the wiring pattern.

According to another aspect of the present invention, there is provided a stacked-type semiconductor unit having a plurality of semiconductor devices stacked on a base board, each comprising a semiconductor chip having flexibility and including an internal electrode; a wiring board having flexibility and including a wiring pattern electrically connected to the internal electrode of the semiconductor chip; and an external electrode provided in an end portion of the wiring board and electrically connected to the wiring pattern, the stacked-type semiconductor unit comprising:
  a base electrode formed on the base board; and
  solder electrically connecting and fixing the external electrodes of the plurality of semiconductor devices to the base electrode, in a state where the plurality of semiconductor devices are stacked on the base electrode formed on the base board such that the external electrodes of the plurality of semiconductor devices are aligned.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 21 is a plan view of a semiconductor device according to a thirteenth embodiment of the present invention;

FIG. 22A is an exploded perspective view of a plurality of semiconductor devices to be stacked;

FIG. 22B is a perspective view of a stacked-type semiconductor unit;

FIGS. 25A to 25C are diagrams for explaining procedures for manufacturing a semiconductor device according to a fourteenth embodiment of the present invention;

FIG. 26 is a cross-sectional view showing a state in which wiring boards are stacked on a base board;

DETAILED DESCRIPTION OF THE INVENTION

Figure 1A:
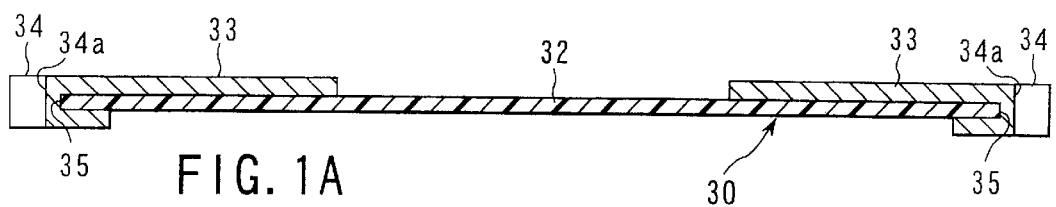
FIGS. 1A to 1C are diagrams for explaining procedures for manufacturing a semiconductor device according to a first embodiment of the present invention.

Embodiments of the present invention will be described with reference to the accompanying drawings.

FIGS. 1 to 6E show a first embodiment of the present invention. FIGS. 1A to 1C show a method for manufacturing a semiconductor device 31. A reference numeral 30 denotes a wiring board having a holding portion 32 made of flexible synthetic resin sheet, which is flexible and electrically insulating, for example, polyimid sheet of a thickness of 25 $\mu$m. A wiring pattern 33 made of copper or the like, having a thickness of, for example, 18 $\mu$m, is formed on one surface of the holding portion 32.

Figure 2:
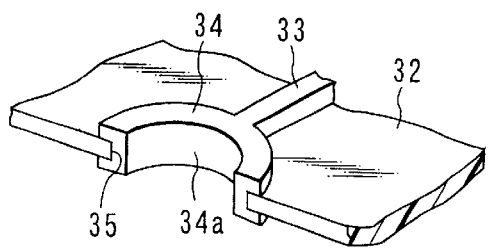
FIG. 2 is a perspective view showing an electrode formed in an end portion of the wiring board.

Electrodes (external electrodes) 34, electrically connected to the wiring pattern 33, are formed on both ends in the width direction of the holding portion 32. Each electrode 34 has a recess, or a semicircular through hole 34a, as shown in FIG. 2. More specifically, a semicircular recess 35 is formed in an end portion of the holding portion 32, and the electrode 34 is provided on the inner periphery of the recess 35 and the upper and lower surfaces of the holding portion 32 along the recess 35. The shape of the recess 35 is not limited to the semicircle, but may be a triangle or rectangle, so far as it is open outward from the wiring board 30.

Figure 1B:
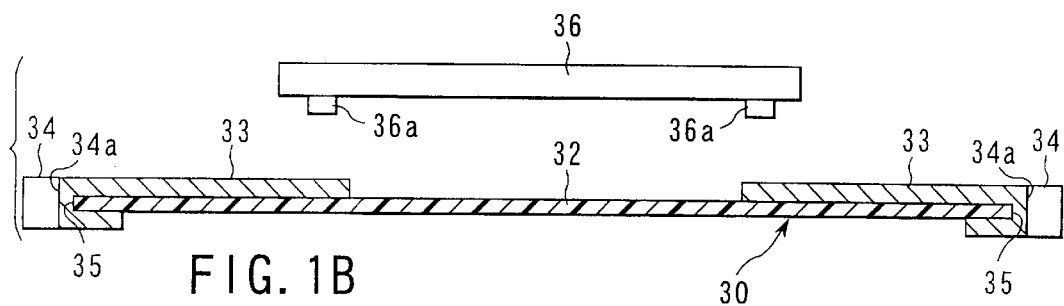
Figure 1C:
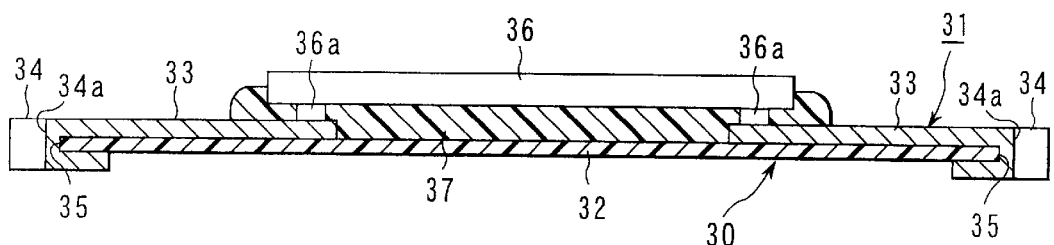

A semiconductor chip 36 as shown in FIG. 1B is mounted on the wiring pattern 33. The semiconductor chip 36 has a thickness of, for example, 50 $\mu$m. Bumps (internal electrodes) 36a having a height of 10–30 $\mu$m, made of gold (Au) or the like, are formed on one surface of the semiconductor chip 36. The semiconductor chip 36 is connected to the wiring pattern 33 via the bumps 36a by flip-chip bonding. The 50 $\mu$m-thick semiconductor chip 36 is much thinner than the conventional chip. Therefore, the semiconductor chip has flexibility of being able to bend.

Figure 5:
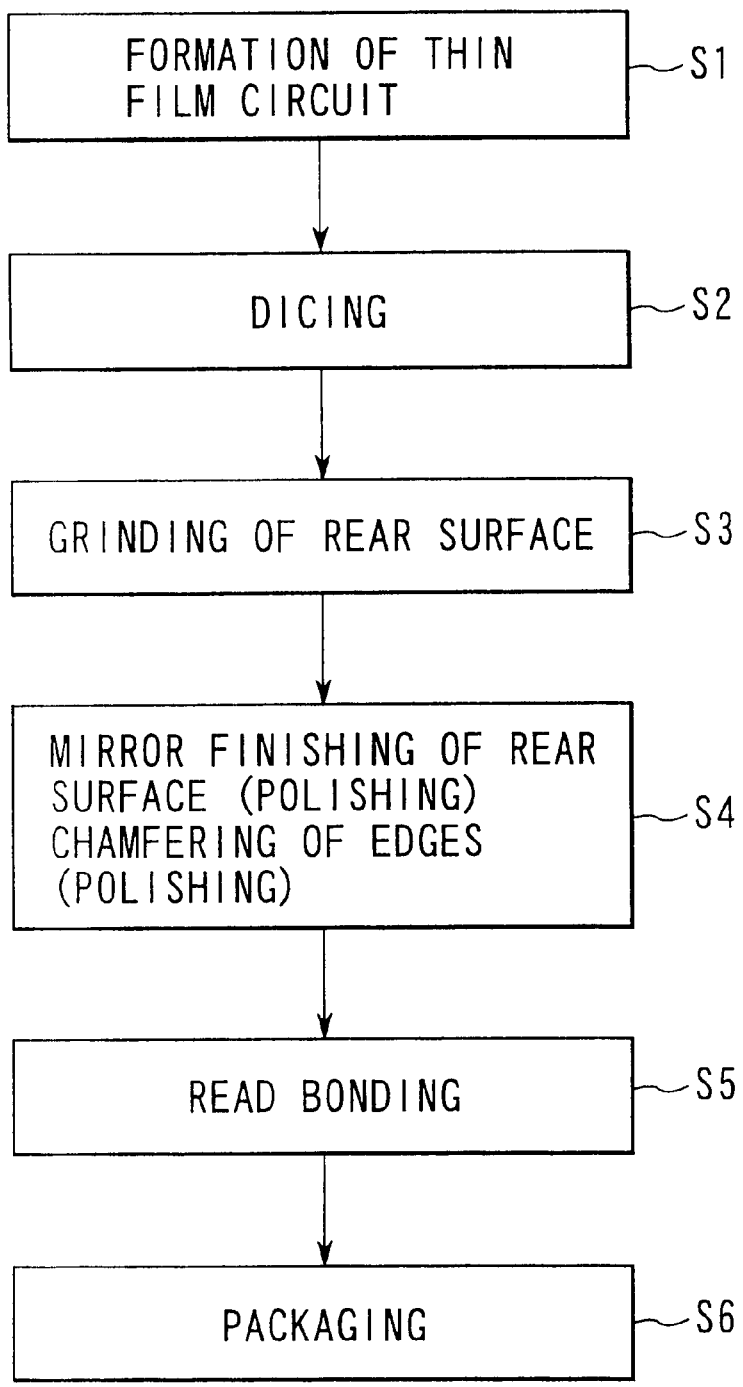
FIG. 5 is a flowchart showing a process for manufacturing a semiconductor device.

A process for manufacturing a semiconductor device of the present invention will be described with reference to the flowchart of FIG. 5 and the schematic diagrams of FIGS. 6A to 6E.

Figure 6A:
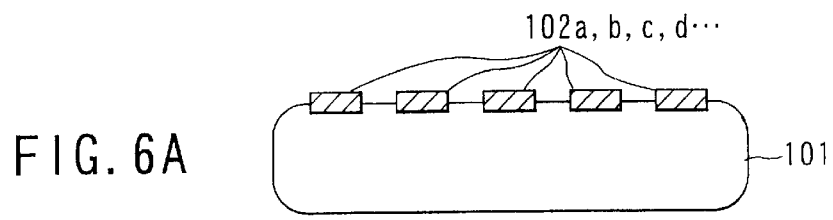
FIGS. 6A to 6E are schematic diagrams for explaining a process for manufacturing a semiconductor device.

First, as shown in FIG. 6A, elements (thin film circuits) 102a, 102b, 102c, . . . are formed on a semiconductor wafer 101 having a thickness of 400 $\mu$m (S1).

Figure 6B:
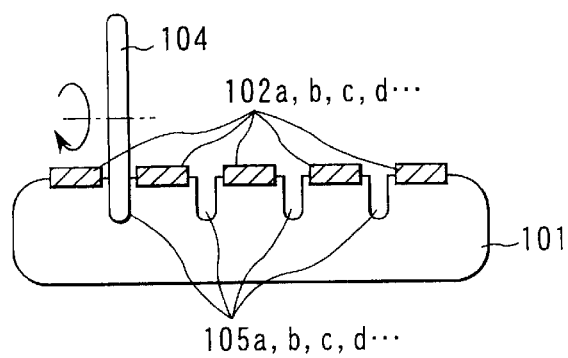

Subsequently, as shown in FIG. 6B, that surface of the semiconductor wafer 101, on which the elements 102a, 102b, 102c . . . are formed, is half-cut by dicing with a blade 104 to form 140 µm-deep grooves 105a, 105b, 105c, . . . lengthwise and crosswise (S2).

Then, the rear surface of the semiconductor wafer 101, on which the elements are not formed, is uniformly grinded by abrading or lapping, so that the thickness of the semiconductor wafer 101 is reduced (S3).

Figure 6C:
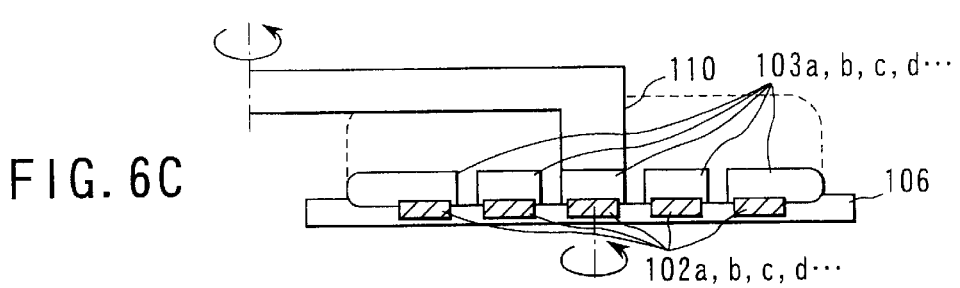

The grinding process is carried out in the following manner. As shown in FIG. 6C, a covering tape 106 for protecting circuits is adhered to that surface of the semiconductor wafer 101 on which the elements 102a, 102b, 102c, . . . are formed. The other surface of the semiconductor wafer 101, on which the elements 102a, 102b, 102c, . . . are not formed, i.e., the rear surface, is ground to reduce the thickness of the semiconductor wafer 101.

The above grinding process is performed by a vertical-shaft in-feed grinder (not shown). The semiconductor wafer 101 is held by a porous chuck having a smooth plane. During the process, the semiconductor wafer 101 is fixed by evacuation by means of a vacuum pump.

The semiconductor wafer 101 is rotated at the rate of 300 r.p.m and processed by a cup-shaped diamond grinder 110 rotated at the high rate of 3000 r.p.m, while the grinder is cutting in the semiconductor wafer 101 in the thickness direction at a feed rate of about 50 µm/min. The cup-shaped diamond grinder 110 has a grain size of about #360 to #3000, and thermosetting resin or ceramic is used as a binding agent. As the semiconductor wafer 101 is thinned by the grinding described above, it is divided into semiconductor chips 103a, 103b, 103c, . . . when the grinder reaches the grooves 105a, 105b, 105c, . . . which have been formed in advance by dicing.

Figure 6D:
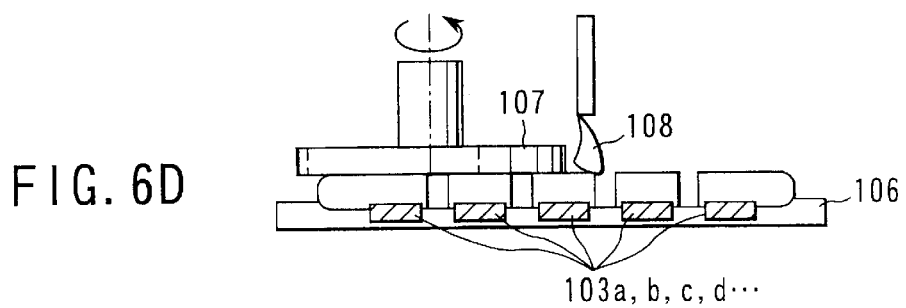
Figure 6E:
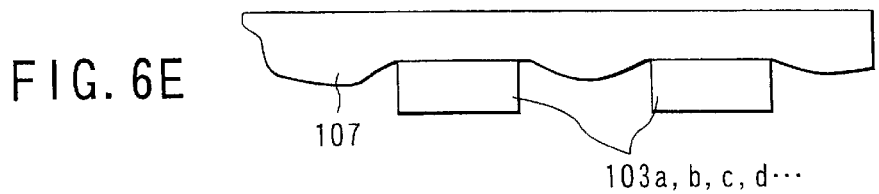

Then, as shown in FIG. 6D, a polishing process using an elastic pad 107 and slurry 108 is carried out (S4), so that the semiconductor chips 103a, 103b, 103c, . . . are thinned to 80 µm or thinner (in this embodiment 50 µm). The elastic pad 107 is made of polyurethane. The slurry 108 comprises fine particles of silica ($SiO_2$) having a grain size of 0.1 µm or smaller, an amine additive, a dispersing agent and pure water. When the semiconductor chips 103a, 103b, 103c, . . . are thinned to 80 µm or thinner, it is given flexibility. Therefore, even if force in a bending direction is applied to the chips, brakeage of the chips is suppressed as far as possible.

Further, when the semiconductor chips 103a, 103b, 103c, . . . are polished using the elastic pad 107 and the slurry 108, a load is concentrated at the chip edge portions due to the elastic action of the elastic pad 107. As a result, the removal rate at the chip edge portions is increased, so that the chip edge portions can be chamfered. Owing to the chamfering, brakeage of the chips is further suppressed, even if force in a bending direction is applied to the chips. In addition, since the amine additive has a function of chemically etching the semiconductor chips 103a, 103b, 103c, . . . , the chemical etching action is also provided.

The semiconductor chips 103a, 103b, 103c, . . . obtained as described above are adhered to a lead frame by lead bonding or using an insulating paste or a conductive paste containing Ag (S5). Thereafter, they are sealed with a sealing material (not shown) and packaged (S6).

In the flip-chip bonding of the semiconductor chip 36, an anisotropic conductive material 37, made of resin in which conductive particles are dispersed, is interposed between the holding portion 32 and the semiconductor chip 36, and crimped at a temperature of, for example, 180° C. As a result, the bumps 36a of the semiconductor chip 36 are electrically connected to the wiring pattern 33 and the surface of the semiconductor chip 36 facing the holding portion 32 and the peripheral surface thereof are sealed with resin.

The semiconductor chip 36 may be bonded by a method other than that using the anisotropic conductive material 37, for example, by soldering or crimping. The wiring pattern 33 and the semiconductor chip 36 may be connected by either batch bonding or single point bonding.

A plurality of, in this embodiment, four semiconductor devices 31 manufactured in the manner described above are stacked on a base board 41. Procedures for forming such a stacked-type semiconductor will be described with reference to FIGS. 3A to 3C.

Figure 3A:
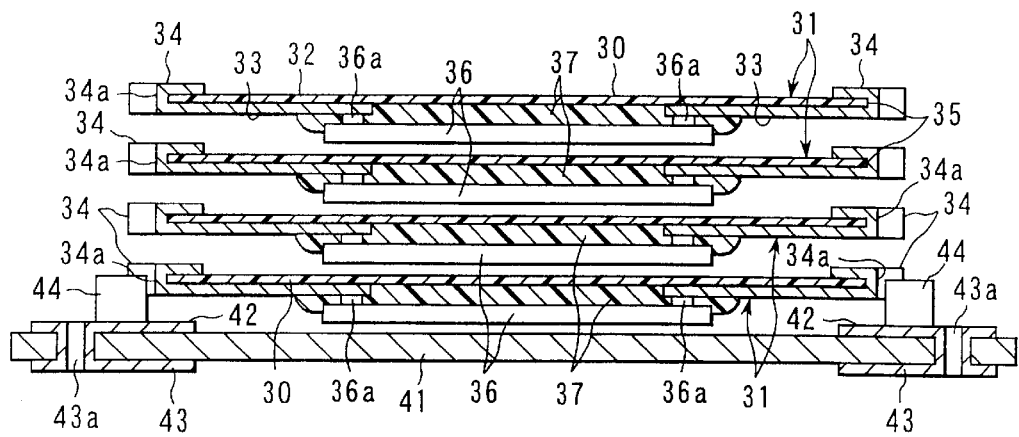
FIGS. 3A to 3C are diagrams for explaining steps of stacking and fixing a plurality of semiconductor devices on a base board.

The base board 41 is made of an electrically insulating material, such as glass epoxy resin. As shown in FIG. 3A, connecting lands 42 serving as base electrodes, made of metal such as copper, are formed on both end portions of the upper surface of the base board 41. The connecting lands 42 are electrically connected to a wiring pattern 43 formed on the lower surface of the base board 41 via through holes 43a.

Solder paste 44 of a predetermined shape is supplied to a predetermined position of each connecting land 42 of the base board 41 in advance by printing or application. The solder 44 supplied to the base board 41 may be kept pasty or heated in a reflowing furnace to form a ball bump and fixed to the connecting land 42. At this time, although the base board 41 is heated, it does not substantially bent, since it is made of glass epoxy resin.

The four semiconductor devices 31 are mounted on the base board 41 by means of a mount tool or the like (not shown). Referring to FIG. 3A, a gap is formed between the wiring boards 30 of the adjacent semiconductor devices 31. Actually, however, since the semiconductor devices 31 are pressed against the base board 41 by a pressing tool (not shown), they are adhered with one another with substantially no gap therebetween.

Figures 4A, 4B, 7A, 7B:
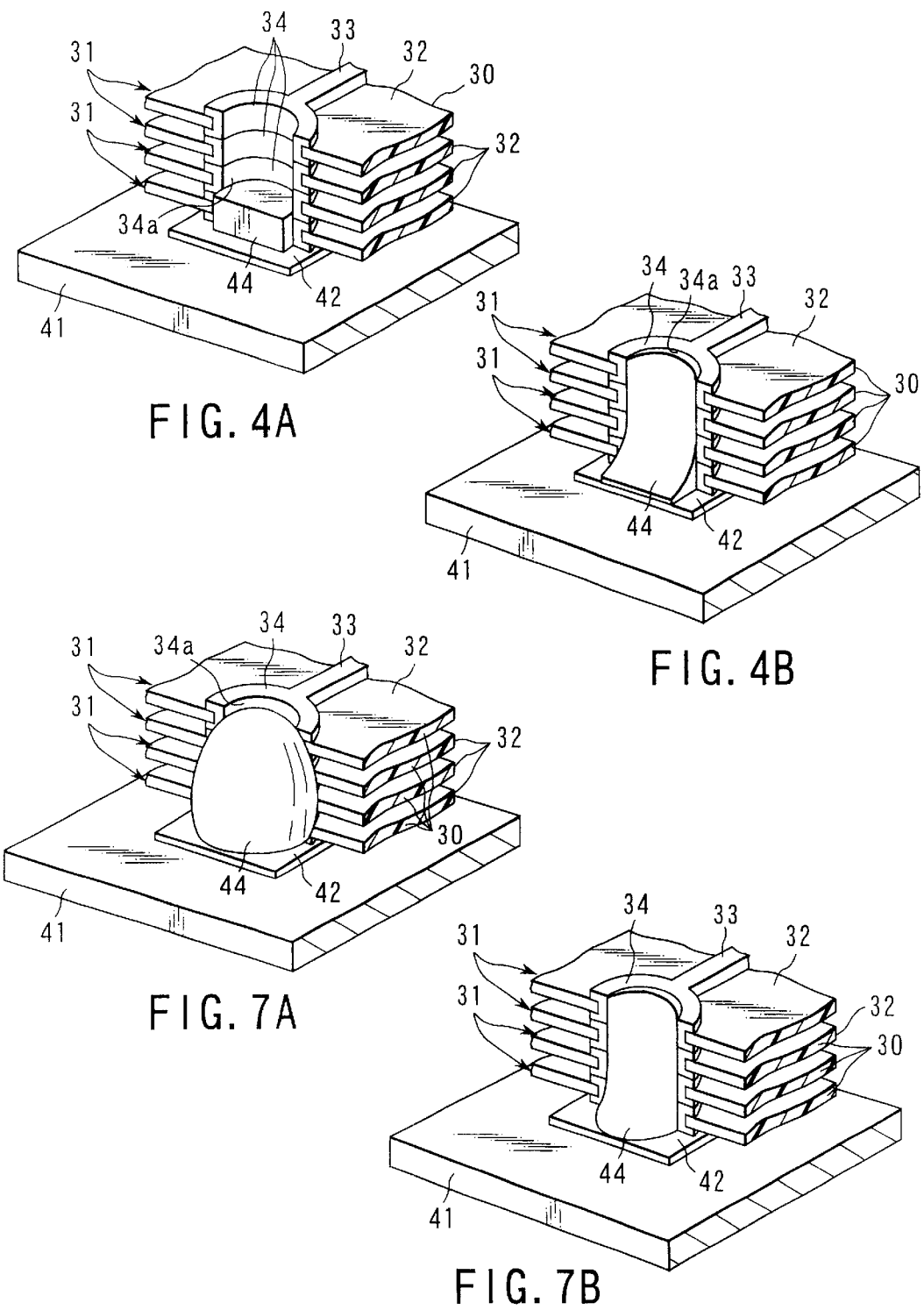
FIG. 4A is a perspective view showing the positional relationship between electrodes of wiring boards and solder paste supplied to a connecting land of the base board.
FIG. 4B is a perspective view showing a state in which the electrodes are connected and fixed by the solder shown in FIG. 4A.
FIG. 7A is a perspective view showing the positional relationship between electrodes and a solder ball supplied to a connecting land of the base board according to a second embodiment of the present invention.
FIG. 7B is a perspective view showing a state in which the electrodes are connected and fixed by the solder shown in FIG. 7A.

The four wiring boards 30 of the semiconductor devices supplied on the base board 41 are aligned such that the electrodes 34 formed on both end portions of the holding portions 32 lie on top of one another along the vertical direction. The solder 44 supplied beforehand to the connecting lands 42 of the base board 41 faces the electrodes 34 of the four wiring boards 30, as shown in FIG. 4A. More specifically, the solder 44 is positioned such that a part thereof enters the through hole 34a of each electrode 34.

Figure 3B:
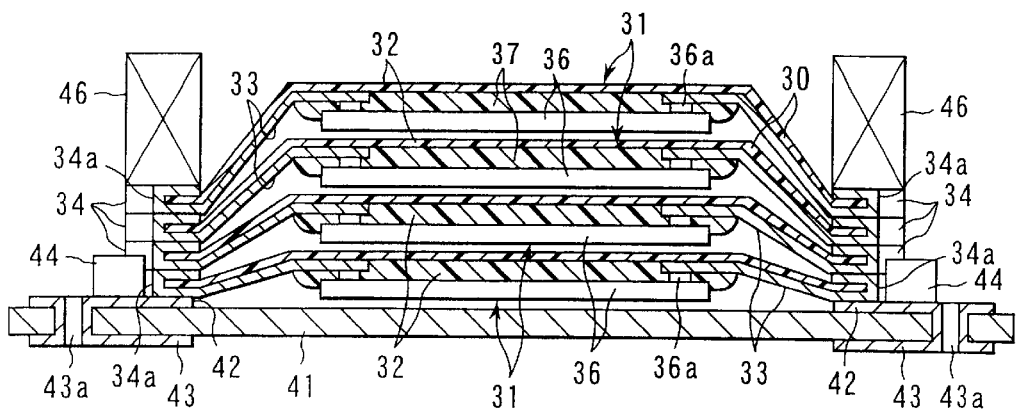

Thereafter, as shown in FIG. 3B, a heater tool 46 is pressed against the portions of the electrodes 34 of the uppermost wiring board 30 to apply pressure and heat. The holding portions 32 of each wiring board 30 and the semiconductor chip 36 mounted thereon are bent by pressure applied to the uppermost electrode 34. As a result, the electrodes of the corresponding portions of the wiring boards 30 are brought into cross contact with one another.

Thus, since the heat from the heater tool 46 is transmitted to the solder 44 via the electrodes 34 in contact with one another and the connecting land 42 of the base board 41, the solder 44 is heated and melted.

Figure 3C:
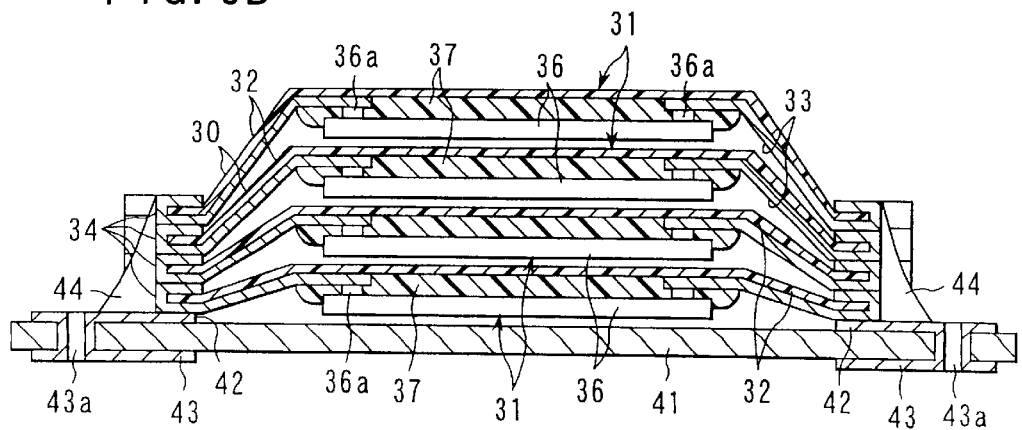

As shown in FIGS. 3C and 4B, the molten solder 44 flows upward from below along the through holes 34a of the closely contacted four electrodes 34, thereby forming fillets. As a result, the electrodes 34 are electrically connected and fixed to the connecting lands.

With the stacked-type semiconductor unit having the above structure, the wiring boards 30 of the semiconductor devices 31 are stacked on the base board 41 and the electrodes 34 formed on the end portions of the wiring boards 30 are pressurized and heated by the heater tool 46. Thus, the solder paste 44 supplied to the connecting lands 42 of the base board 41 is melted, so that the electrodes 34 of the wiring boards 30 can be electrically connected and fixed to the connecting lands 42. Therefore, the stacked-type semiconductor unit can be manufactured easily at low cost.

In addition, the electrodes 34 of the four wiring boards 30 are reliably soldered to the connecting lands 42 of the base board 41 such that they lie one upon another. With this structure, since the area of the connecting land 42 need not be increased, the stacked-type semiconductor unit can meet the requirements for compactness of the device and a reduction in pitch.

Further, the solder 44 is supplied to the base board 41, while the electrodes 34 of the wiring boards 30 are brought into contact with one another in the vertical direction, and the electrodes 34 of the uppermost wiring board is pressed and heated by the heater tool 46.

As a result, the solder 44 supplied to the connecting lands 42 is melted by the heat transmitted through the electrodes 34. In other words, the electrodes 34 of the stacked wiring boards 30 are soldered without heating the wiring boards 30 in a reflowing furnace.

For this reason, the wiring boards 30 are not bent and no defect occurs in contact portions between the semiconductor chips 36 and the wiring patterns 33. Therefore, the stability and reliability of the manufacturing process is ensured.

The holding portions 32 of the wiring boards 30 and the semiconductor chips 36 mounted on the holding portions 32 have flexibility of being able to bend. Since the holding portions 32 and the semiconductor chips 36 are bent and deformed when the electrodes 34 of the stacked wiring boards 30 are pressurized and heated by the heater tool 46, the electrodes 34 of the four wiring boards 30 are pressed surely without crack or breakage.

When the electrodes 34 of the four wiring boards 30 are pressed, the heat generated by the heater tool 46 is transmitted surely to the solder 44 through the electrodes 34 and the connecting lands 42 of the base board 41. Therefore, the solder 44 is melted quickly to connect and fix the electrodes 34.

FIGS. 7A and 7B shows a second embodiment of the present invention, modified from the first embodiment. In the second embodiment, a solder ball 44, instead of the solder paste, is supplied to each connecting land 42 of the base board 41.

The solder ball 44 supplied to the connecting land 42 is held by flux (not shown). However, the base board 41 may be heated by a reflowing furnace to form a ball bump from the solder ball to be fixed to the connecting land 42.

The base board 41 is made of, for example, glass epoxy resin, not a soft material as the holding portions 32 of the wiring boards 30. Therefore, even if it is heated in the reflowing furnace, deterioration in quality, such as a warp, will not occur.

Even in the case where the solder ball 44 is provided on the connecting land 42 of the base board 41, it flows along the four stacked electrodes 34 to form a fillet, as shown in FIG. 7B, by pressurizing and heating the electrodes 34 of the wiring boards 30 by the heater tool 46. Thus, the four wiring boards 30 are physically and electrically connected to the connecting land 42 of the base board 41. In the case of using the solder ball 44, it is preferable that the heater tool 46 heat the solder at about 250° C.

In the first and second embodiments, the wettability of the solder is increased by providing flux on the electrodes 34 and the connecting lands 42 of the base board 41.

Figure 8A:
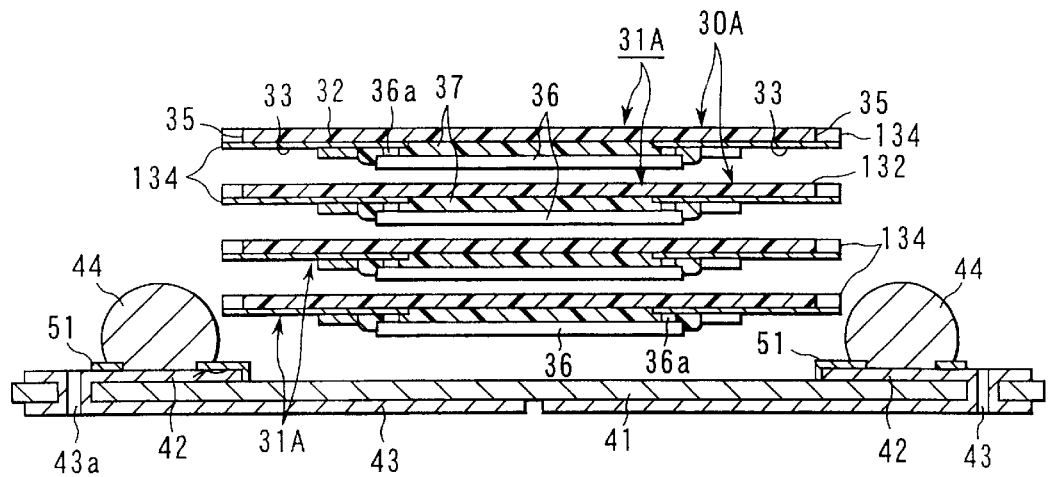
FIGS. 8A to 8C are diagrams for explaining steps of stacking and fixing a plurality of semiconductor devices on a base board according to a third embodiment of the present invention.
Figure 8B:
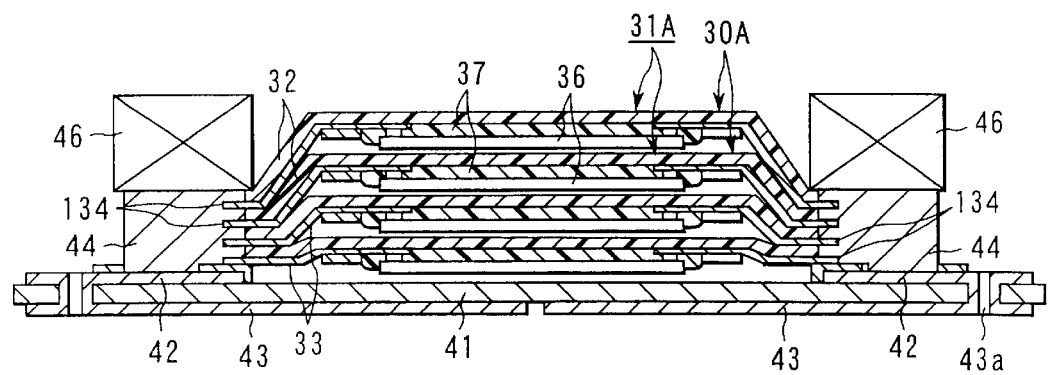
Figure 8C:
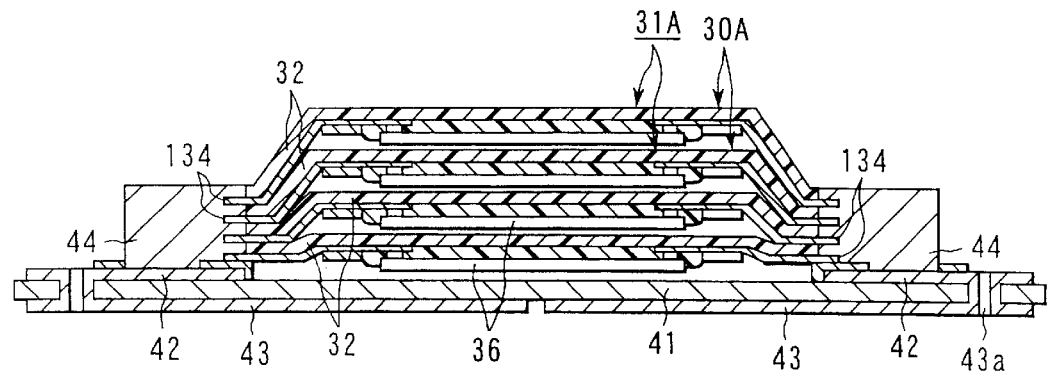
Figure 9A:
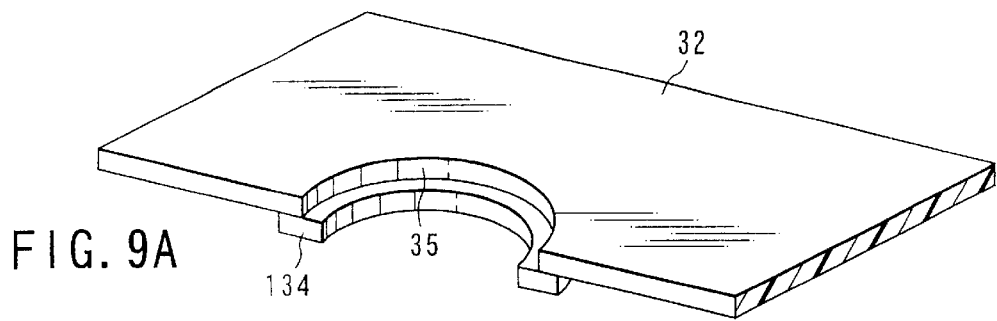
FIGS. 9A and 9B are perspective views showing an electrode formed on the wiring board.
Figure 9B:
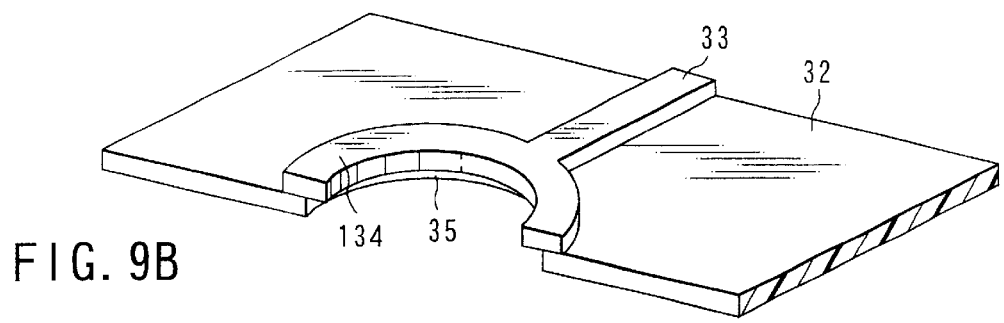

FIGS. 8A to 8C, 9A and 9B show a third embodiment of the present invention. In the third embodiment, a wiring board 30A of a semiconductor device 31A has electrodes whose shape is different from that of the first embodiment. As shown in FIGS. 9A and 9B, the electrode 134 of this embodiment is formed on only one surface of the holding portion 32, i.e., the surface where the wiring pattern 33 is formed, on which the semiconductor chip 36 is to be mounted.

More specifically, a semicircular recess (cut portion) 35 is formed in an end portion of the holding portion 32 so as to open at the end face thereof. The electrode 134 made of metal, such as copper, is formed on one surface of the holding portion 32 along the periphery of the recess 35 and projects into the recess 35.

The other portions of the wiring board 30A are entirely the same as those in the first embodiment in structure, material and size. Therefore, descriptions thereof will be omitted.

FIGS. 8A to 8C show procedures of stacking and fixing to a base board four wiring boards 30A on which the electrodes 134 are formed. Connecting lands 42 formed on the base board 41 are partially covered by resist 51. Solder 44 is provided in advance to the exposed portions of the connecting lands 42.

The solder 44 is formed as follows. In a method, solder balls are supplied to the connecting lands 42, and the base board 41 is heated in a reflowing furnace to form a ball bump to fix the solder balls to the connecting lands 42. In another method, solder paste is printed on the connecting lands 42, the base board 41 is heated in a reflowing furnace to form a ball bump to fix the solder paste. Alternatively, the solder 44 may be kept ball-shaped or pasty without heating the base board 41 in a reflowing furnace.

As shown in FIG. 8A, four semiconductor devices 31A are sequentially aligned in a predetermined state on the base board 41 on which the solder 44 is supplied to the connecting lands 42. More specifically, the wiring board 30A of each semiconductor device 31A is positioned such that the electrodes 134 face the solder 44 provided on the connecting lands 42.

Then, as shown in FIG. 8B, end portions of the uppermost wiring board 30A, on which the electrodes 134 are formed, are heated and pressurized by a heater tool 46 at a temperature of 230–250° C. As a result, the heat of the heater tool 46 is transmitted to the solder 44 on the connecting lands 42 through the closely contacted electrodes 134 of the wiring boards 30A. Then, since the solder 44 is melted, the electrodes 134 of the wiring boards 30A are electrically connected and fixed to the connecting lands 42 of the base board 41.

In the stacked-type semiconductor unit obtained by stacking the four semiconductor devices 31A as described above, the wiring board 30A of each semiconductor device 31A is 80–100 μm thick. The overall structure, including the four-stacked wiring boards 30A, is as thin as 600 μm.

The stacked-type semiconductor unit of this embodiment can be manufactured reliably as in the case of the first embodiment through a simple manufacturing process without causing a defect. Moreover, since the electrodes 134 are formed on only one surface of the holding portion 32, the cost can be reduced as compared to the case of forming electrodes on both surfaces of the holding portion 32.

FIGS. 10A and 10B to 12A and 12B show fourth to sixth embodiments, in which electrodes 134a, 134b and 134c are formed on one surface of the holding portion 32.

Figure 10A:
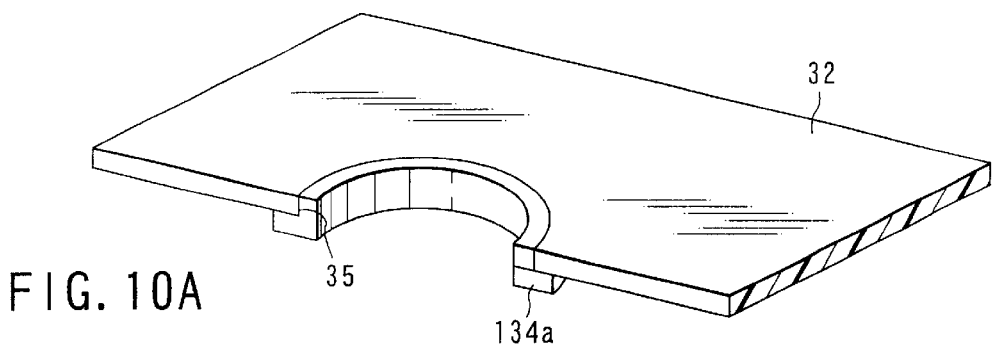
FIGS. 10A and 10B are perspective views showing an electrode formed on the wiring board according to a fourth embodiment of the present invention.
Figure 10B:
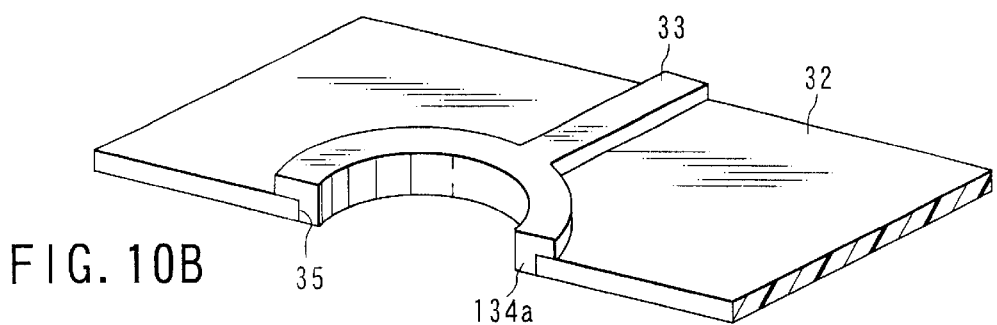

The fourth embodiment shown in FIGS. 10A and 10B is different from the third embodiment in that the electrode 134a is formed on the inner periphery of the semicircular recess 35 as well as one surface of the holding portion 32. Since the electrode 134a is formed on both the surface of the holding portion 32 and the inner periphery of the recess 35, the heat generated by a heater tool is transmitted more efficiently. In addition, when the solder 44 supplied to the base board 41 is melted, the contact area between the solder 44 and the electrode 134a is wider than that in the third embodiment. Therefore, the connecting strength between the stacked wiring board 30A and the connecting land 42 of the base board 41 can be increased.

Figure 11A:
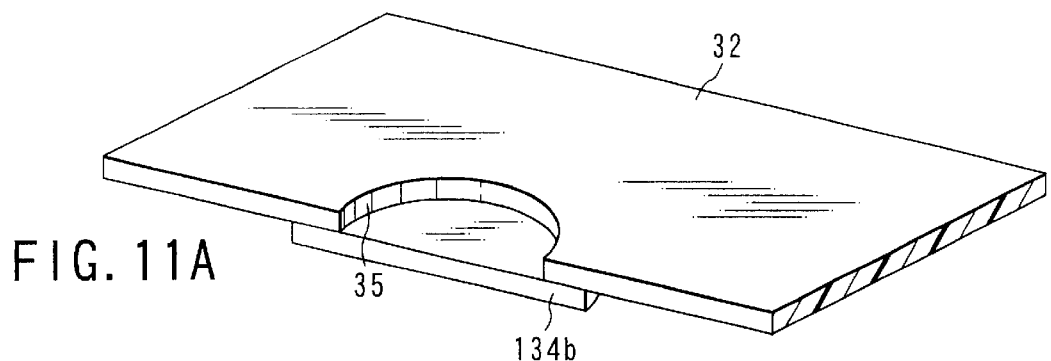
FIGS. 11A and 11B are perspective views showing an electrode formed on the wiring board according to a fifth embodiment of the present invention.
Figure 11B:
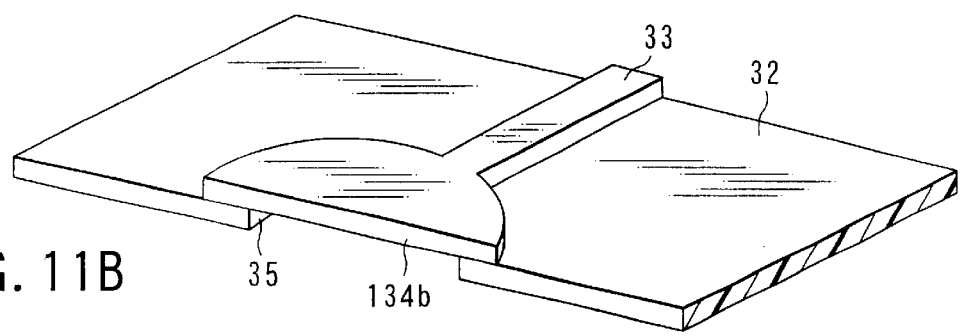

In the fifth embodiment shown in FIGS. 11A and 11B, the electrode 134b has a semicircular shape larger than the semicircular recess 35 formed in the holding portion 32. The electrode 134b is provided on one surface of the holding portion 32 so as to cover the recess 35.

Figure 12A:
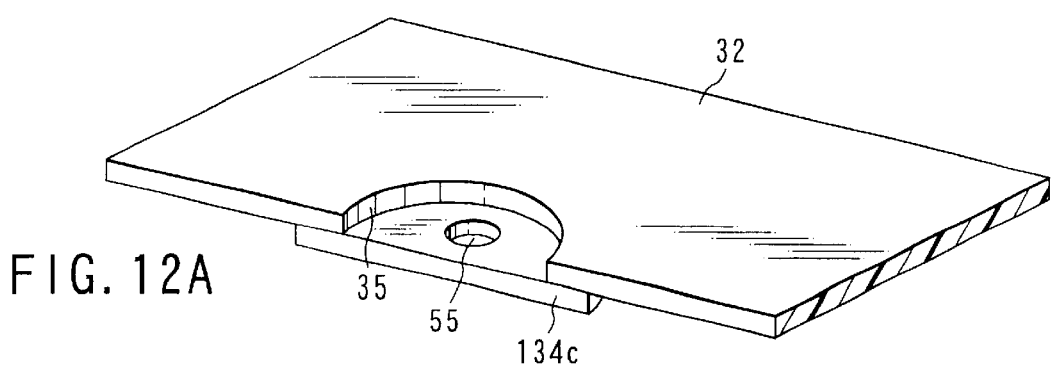
FIGS. 12A and 12B are perspective views showing an electrode formed on the wiring board according to a sixth embodiment of the present invention.
Figure 12B:
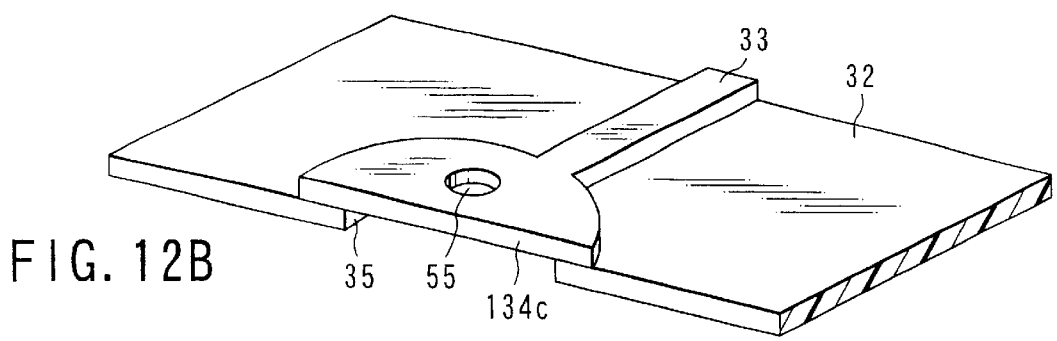

The sixth embodiment shown in FIGS. 12A and 12B is substantially the same as the fifth embodiment, but different therefrom in that the electrode 134c has a through hole 55 formed in a portion covering the recess 35. Since the through hole 55 is formed in that portion of the electrode 134c which covers the recess 35, when the solder 44 on the base board 41 is melted, the molten solder 44 easily flows upward through the through hole 55. Therefore, the electrodes 134c stacked one on another can be connected firmly without fail.

Figure 13A:
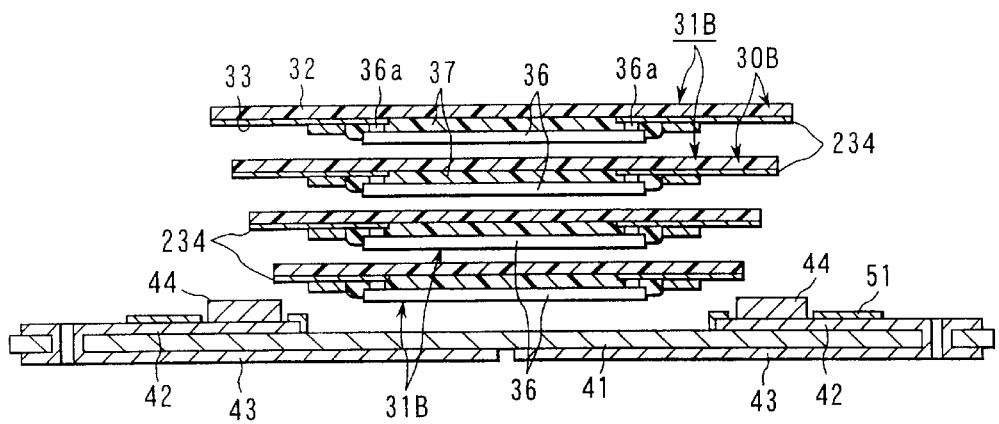
FIGS. 13A to 13C are diagrams for explaining steps of stacking and fixing a plurality of semiconductor devices on a base board according to a seventh embodiment of the present invention.
Figure 13B:
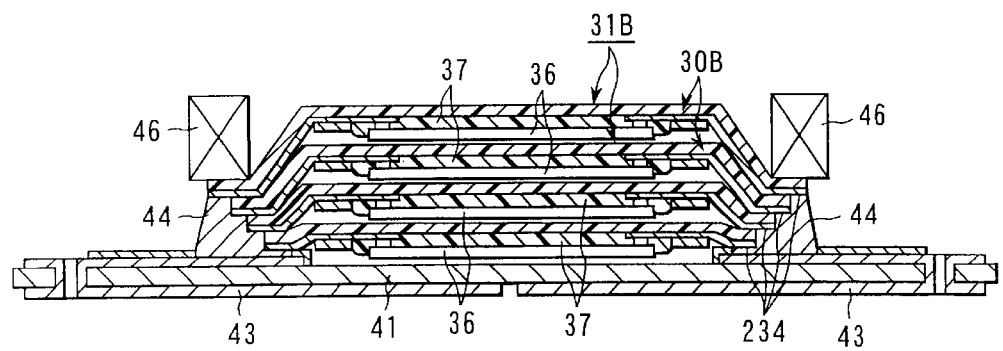
Figure 13C:
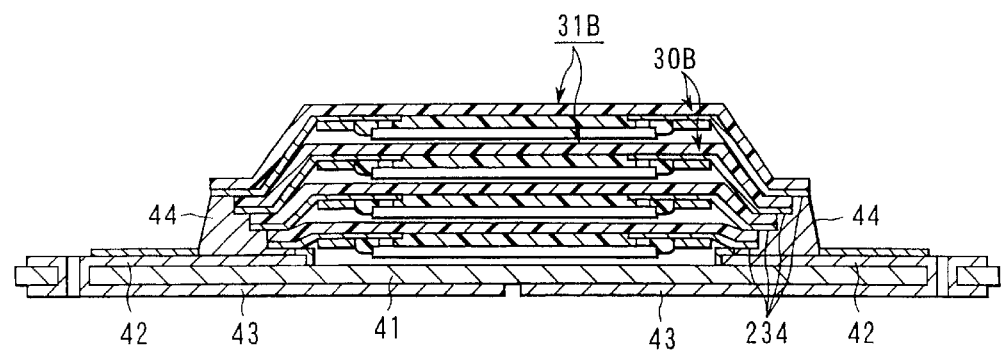
Figure 14:
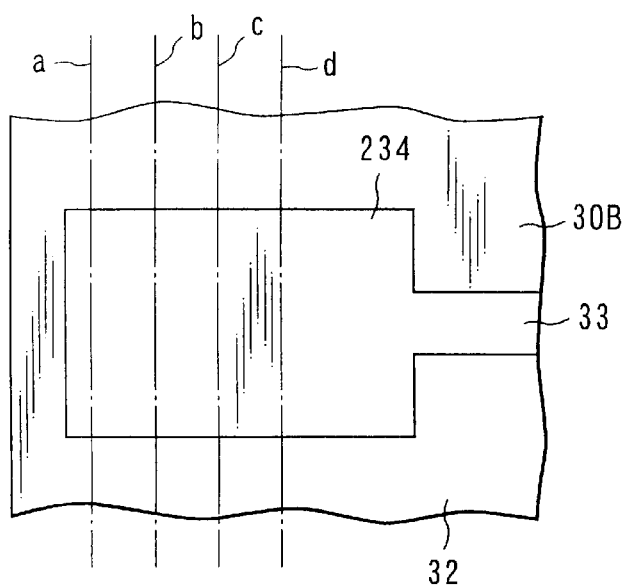
FIG. 14 is a plan view showing an electrode formed on an end portion of the wiring board.

FIGS. 13A to 13C and 14 shows a seventh embodiment of the present invention. As shown in FIG. 14, a rectangular electrode 234 having a predetermined length and continuous to a wiring pattern 33 is formed in an end portion of a holding portion 32 of the wiring board 30B of each semiconductor device 31B. The holding portion 32 does not have a recess 35.

As shown in FIG. 13A, when four wiring boards 30B are stacked on a base board 41, holding portions 32 are stamped out to have different lengths in the width direction of the wiring boards 30B. More specifically, as indicated by the cutting lines a–d in FIG. 14, the holding portions 32 and the electrodes 234 of the respective wiring boards 30B are stamped out together such that the lengths of the electrodes 234 are longer in the order of being stacked on the base board 41 (d→c→b→a).

As shown in FIG. 13A, solder paste 44 is provided on the connecting lands 42 of the base board 41 by printing or other means. The four wiring boards 30B having different sizes are sequentially stacked on the base board 41, in the order from the smallest to the largest. As a result, the four stacked wiring boards 30B have step-wise ends, which face the solder 44.

Then, as shown in FIG. 13B, the portions of the electrodes 234 of the uppermost wiring board 30B are pressurized and heated by a heater tool 46. As a result, the solder 44 is heated and melted, as shown in FIG. 13C. Therefore, the electrodes 234 of the wiring boards 30B facing the solder 44 are electrically connected and fixed to the connecting lands 42 of the base board 41 by the solder 44.

In this embodiment, solder balls 44, instead of the solder paste, may be supplied to the connecting lands 42. After the solder 44 is supplied to the connecting lands 42 and before the wiring boards 30B are stacked on the base board 41, the base board 41 may be put into a reflowing furnace to melt the solder 44, thereby forming ball bumps, so that the solder can be fixed firmly to the connecting lands 42.

Figure 15:
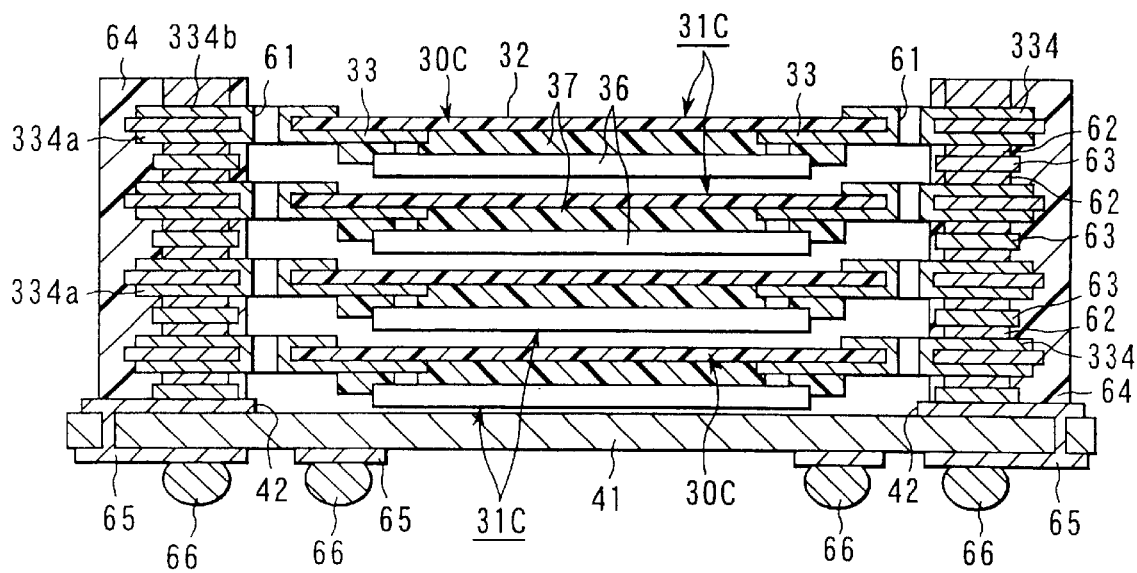
FIG. 15 is a cross-sectional view showing a schematic structure of a stacked-type semiconductor unit according to an eighth embodiment of the present invention.
Figure 16A:
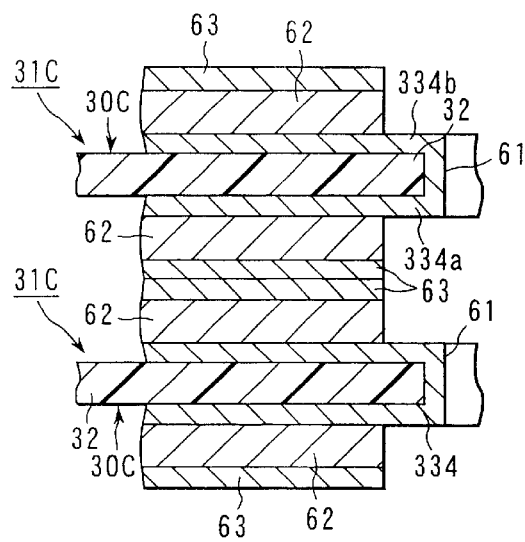
FIGS. 16A and 16B are enlarged cross-sectional views showing electrode portions of stacked semiconductor devices.
Figure 16B:
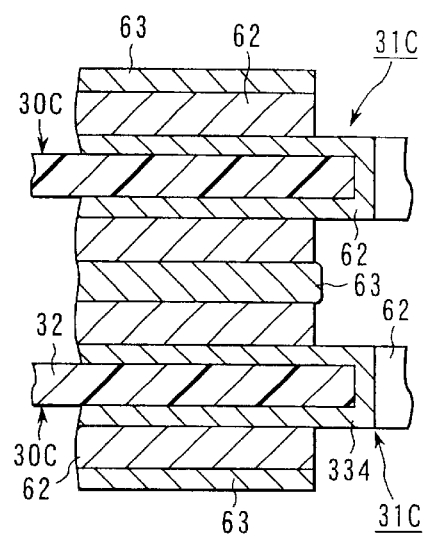

FIGS. 15, 16A and 16B show an eighth embodiment of the present invention. This embodiment is a modification of the connection structure of four wiring boards 30C stacked on the base board 41.

More specifically, an electrode 334 formed on an end portion of a holding portion 32 comprises metal films 334a and 334b. The metal film 334a is provided on one surface (lower surface) of the holding portion 32 and connected to a wiring pattern 33. The metal film 334b is provided on the other surface (upper surface) thereof and electrically connected to the metal film 334a via a through hole 61.

As shown in FIG. 16A, the metal films 334a and 334b of the electrode, formed on the upper and lower surfaces of each wiring board 30C, have base metal layers. The base metal layers are formed by plating the metal films with copper, nickel or the like, to a thickness of 20–40 µm. Further, the base metal layers are plated with solder layers 63 by electrolytic plating to a thickness of 10–20 µm.

As shown in FIG. 15, the four wiring boards 30C are stacked on the connecting lands 42 of the base board 41. Then, the portions of the electrodes 334 of the uppermost wiring board 30C are pressurized and heated by a heater tool (not shown).

As a result, the solder layers 63 between the stacked wiring boards 30C as shown in FIG. 16A are melted and integrated as one piece as shown in FIG. 16B. Thus, the four wiring boards 30C are electrically connected and fixed to the connecting lands 42 of the base board 41 through the metal films 334a of the lower surfaces, the through holes 61 and the upper metal films 334b of the respective electrodes 334.

After the four wiring boards 30C stacked by heating and melting the solder layers 63 are connected and fixed, a sealing material 64 made of, for example, epoxy resin, is applied to the end portions of the holding portions 32 where the electrodes 334 are formed. The sealing material 64 is cured at a temperature of, for example, 150° C., for two hours, thereby sealing the electrodes 334.

After the electrodes 334 formed on the holding portions 32 are sealed with the sealing material 64, solder balls 66 of a diameter of, for example, 0.1–0.5 mm, are adhered by flux to external connecting wires 65 formed on the lower surface of the base board 41, as shown in FIG. 15. Then, the solder balls adhered to the base board are melted in the reflowing furnace, with the result that solder ball bumps having a height of about 0.05–0.5 mm are formed on the wires 65.

Ball bumps (solder 66) need not be formed on the connecting wires 65 on the lower surface of the base board 41. Alternatively, solder may be provided on connecting wires of a circuit board (not shown) on which the semiconductor device is mounted.

In the stacked-type semiconductor unit of the above structure, to connect and fix the four stacked wiring boards 30C, the upper and lower metal films 334b and 334a of the electrode 334 of each wiring board 30C are plated with the base metal layers 62. Thereafter, the solder layers 63 are formed on the base metal layers 62 by electrolytic plating.

Since the solder layers 63 are formed by electrolytic plating, the wiring board 30C need not be heated in the reflowing furnace in order to fix the solder, unlike in the case of the conventional art. Therefore, the wiring board 30C is not bent or the interconnection between the wiring pattern 33 and the semiconductor chip 36 is not damaged.

According to the conventional art, in the case where the two wiring boards 30C stacked one on the other are fixed by the solder layers 63, since the semiconductor chip 36 is formed under the lower surface of the upper wiring board 30C, the distance between the two wiring boards 30C must be set wide enough for the semiconductor chip 36 to be interposed therebetween. Therefore, the solder layers 63 must be thick.

In this embodiment, the portion of the wiring board 30C in which the semiconductor chip 36 is mounted is 80–100 µm thick. The distance between the upper and lower wiring boards 30C is 100–160 µm. Thus, the semiconductor chip 36 is held between the pair of wiring boards 30C.

It is difficult to form a thick solder layer 63 by electrolytic plating in accordance with the thickness of the semiconductor chip 36. However, according to this embodiment, the base metal layer 62 is formed on the electrode 334 and the solder layer 63 is formed on the base metal layer 62. Thus, the solder layer 63 can be thinner than in the case where it is formed directly on the electrode 334. Therefore, the wiring board 30C having the solder layer 63 can be manufactured easily.

Figure 17A:
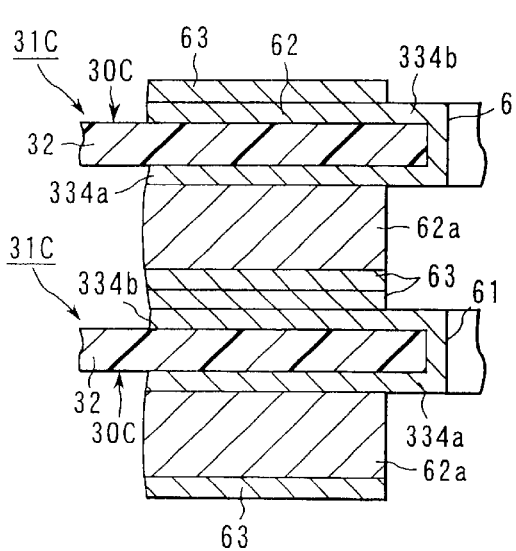
FIGS. 17A and 17B are enlarged cross-sectional views showing electrode portions of stacked semiconductor devices according to a ninth embodiment of the present invention.
Figure 17B:
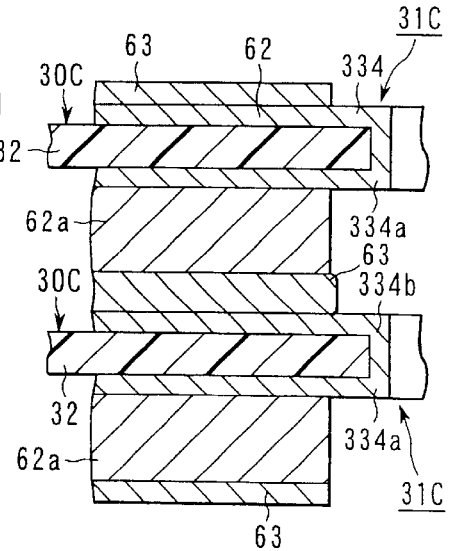

FIGS. 17A and 17B show a ninth embodiment modified from the eighth embodiment. In the ninth embodiment, a base metal layer 62a is formed to a thickness of 40–80 µm on only the lower metal film 334a of the electrode 334 formed on the wiring board 30C. Solder layers 63, having a thickness of 10–20 µm, are formed on the base metal layer 62a and the upper metal layer 334b of the electrode 334.

The portions of the electrodes 334 of the stacked wiring boards 30C are pressurized and heated by a heater tool, with the result that the solder layers 63 interposed between the wiring boards 30C as shown in FIG. 17A are melted and integrated as one piece as shown in FIG. 17B. Thus, the four stacked wiring boards 30C are connected and fixed.

With the above structure, as in the case of the eighth embodiment, the wiring boards 30C need not be heated in the reflowing furnace. Therefore, the wiring boards 30C are not bent or the interconnection between the wiring pattern 33 and the semiconductor chip 36 is not damaged. Moreover, since the thickness of the solder layer 63 can be reduced owing to the existence of the base metal layer 62a, the manufacture of the wiring boards 30C can be simplified.

Figures 18, 19:
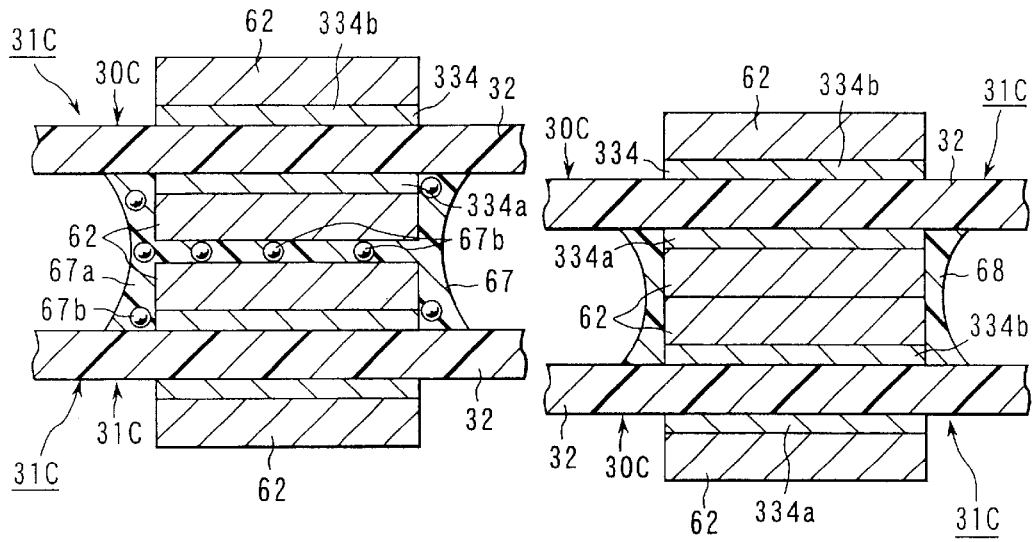
FIG. 18 is an enlarged cross-sectional view showing electrode portions of stacked wiring boards according to a tenth embodiment of the present invention.
FIG. 19 is an enlarged cross-sectional view showing electrode portions of stacked semiconductor devices according to an eleventh embodiment of the present invention.

FIG. 18 shows a tenth embodiment of the present invention, which is a modification of the eighth embodiment. In the tenth embodiment, the base metal layers 62 are formed on the upper and lower metal films 334b and 334a of the electrode 334. Each base metal layer 62, having a thickness of 30–50 µm, is formed by plating the metal film of the electrode with metal such as copper or nickel.

Pasty or film anisotropic conductive material 67, made of epoxy resin 67a and conductive particles (e.g., nickel or gold) 67b mixed therein, is interposed between the base metal layers 62 of the two wiring boards 30C stacked one on the other.

The portions of the electrodes 334 of the stacked wiring boards 30C are pressurized and heated, with the result that the electrodes 334 of the upper and lower wiring boards 30C are electrically connected and fixed by the conductive particles 67b of the anisotropic conductive material 67.

With the above structure, the upper and lower electrodes 334 are electrically connected and fixed without using solder. Therefore, as in the case of the eighth embodiment described above, the wiring boards 30C need not be heated in the reflowing furnace. Consequently, a bent of the wiring boards 30C or a damage of the interconnection between the wiring pattern 33 and the semiconductor chip 36 are prevented.

FIG. 19 shows an eleventh embodiment of the present invention, which is a modification of the tenth embodiment.

In the eleventh embodiment, the wiring boards 30C of a plurality of semiconductor devices 31C are stacked, so that the base metal layers 62 formed on the upper and lower surfaces of the pair of upper and lower electrodes 334 of the wiring boards 30C are brought into contact with each other.

The base metal layers 62 contacted to each other are adhered by adhesive 68 made of, for example, epoxy resin, which is shrunk when hardened. As a result, the base metal layers 62, stacked one on the other, are fixed firmly without fail by the shrinking force of the adhesive 68.

In the eighth to eleventh embodiment described above, the semiconductor devices 31C are stacked on the base board 41. In these embodiments, since the solder 44 need not be supplied in advance to the base board 41 unlike in the case of first embodiment, the stacked semiconductor devices 31C can be connected and fixed without the base board 41.

Figure 20:
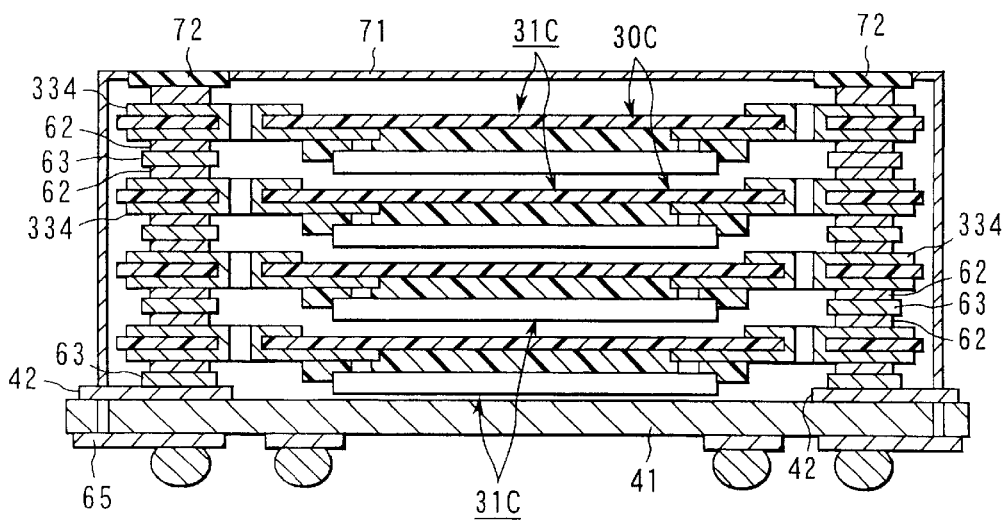
FIG. 20 is a cross-sectional view showing a schematic structure of a stacked-type semiconductor unit according to a twelfth embodiment of the present invention.

FIG. 20 shows a twelfth embodiment of the present invention, which is a modification of the eighth embodiment shown in FIG. 15. In the eighth embodiment, the portions of the electrodes 334 of the stacked wiring boards 30C are sealed with the sealing material 64. In contrast, according to the twelfth embodiment, a package-like metal cap 71 instead of the sealing member 64 covers and seals the stacked semiconductor devices 31C. The metal cap 71 is fixed to the base board 41 by solder or adhesive.

The uppermost wiring board 30C is pressed and held by elastic members 72. With this structure, the semiconductor devices 31C are held stably in the metal cap 71.

In the first to eleventh embodiments, the number of the wiring boards stacked on the base board is not limited four, but may be any plural number.

In the eighth to eleventh embodiments, even if the holding members of the wiring boards and the semiconductor chips held to the holding members are not elastic, no particular obstruct will be presented when the wiring boards are stacked and fixed.

FIGS. 21 to 24B show a thirteenth embodiment of the present invention.

Figure 23A:
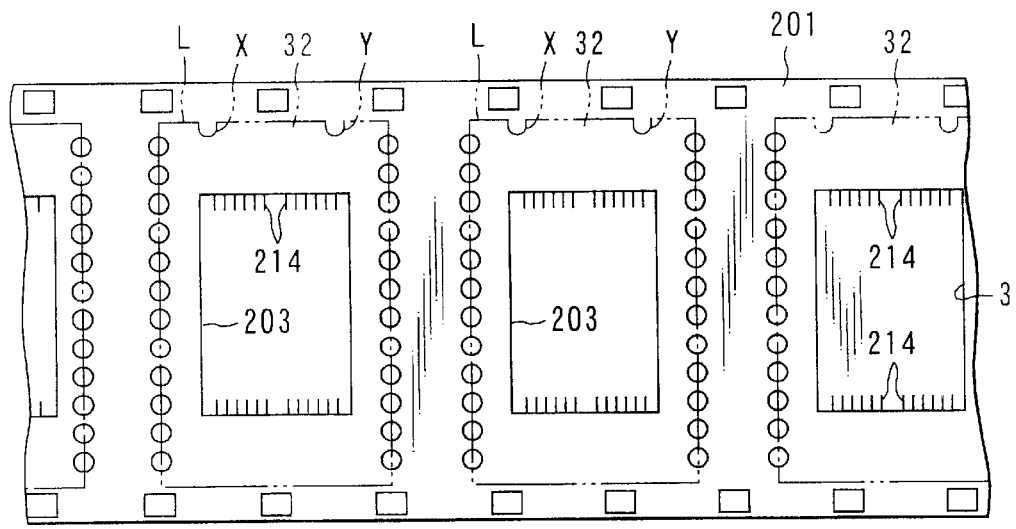
FIG. 23A is a plan view showing a part of a base material on which semiconductor chips have not been mounted.
Figure 23B:
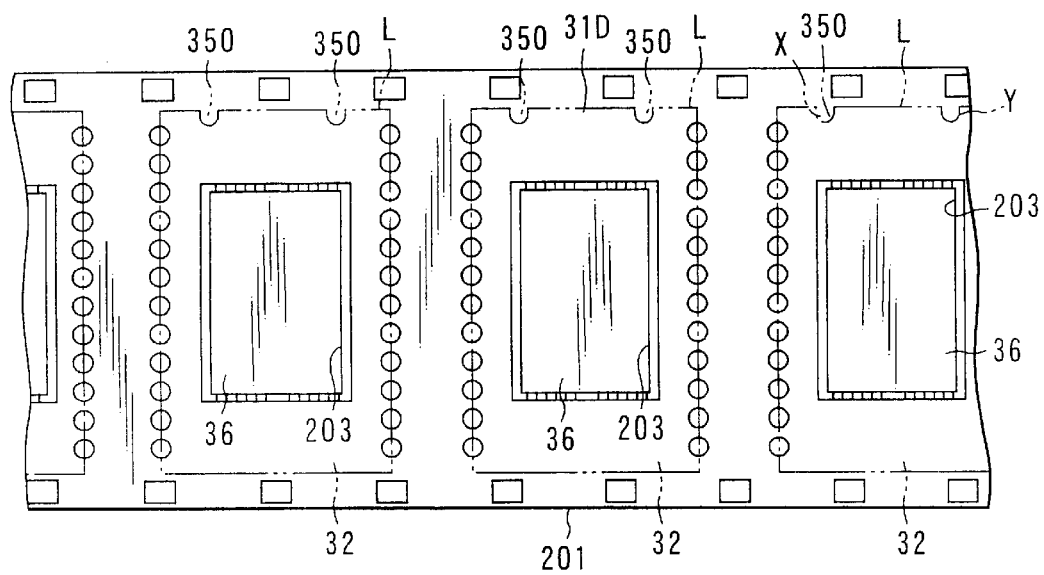
FIG. 23B is a plan view showing the part of the base material on which semiconductor chips have been mounted.

FIG. 23A shows a base member 201 comprising a carrier tape from which a holding member 32 of a TCP (Tape Carrier Package) 31D as shown in FIG. 21, serving as a semiconductor device, is stamped out. The base member 201 has device holes 203. Inner leads 214 of wires 204 (shown in FIG. 21) extend in the device holes 203. As shown in FIGS. 21 and 23B, the semiconductor chip 36 is connected to the inner leads 214 via bump electrodes 36a serving as internal electrodes. The semiconductor chip 36 mounted to the base member 201 is sealed with resin (not shown).

The portions of the base member 201, which are indicated by chained lines L shown in FIGS. 23A and 23B, are stamped out by presswork. As a result, the TCPs 31D, each having the semiconductor chip 36 mounted on the wiring board 30 as shown in FIG. 21, are formed. Four TCPs 31D as shown in FIG. 22A are stacked and integrated in the manner as in the first embodiment, thereby forming a stacked-type semiconductor unit as shown in FIG. 22B.

Consequently, the electrodes 34 stacked one on the other at both end portions of the TCPs 31D are electrically connected and fixed by solder. FIG. 22B does not show that the connected TCPs 31D are mounted on the base board 41. However, the TCPs 31D may be stacked on a base board (not shown). Alternatively, they may be stacked without using a base board in the same manner as in the eighth to eleventh embodiments shown in FIGS. 15 to 19.

A specific one of the semiconductor chips 36 of the stacked-type semiconductor unit 207 can be externally accessed in the following manner, depending on whether two particular wires 204 are cut or not when the TCPs 31D are stamped out from the base member 201.

The cutting of the wires 204 can be performed at the same time as stamping out the holding portion 32 from the base member 201. More specifically, as shown in FIG. 21, two wires 204 are connected to electrodes 34x and 34y, which serve as chip selecting terminals for detecting whether the wires 204 are cut or not. When the wires 204 are printed on the base member 201, the two particular wires 204 are formed such that intermediate portions 204x and 204y are located in an edge portion of the periphery of the holding portion 32.

The intermediate portion 204x of the wire 204 connected to the electrode 34x is formed on one surface of the holding member 32. The intermediate portion 204y of the wire 204 connected to the electrode 34y is formed on the other surface of the holding member 32. Both ends of the intermediate portion 204y are electrically connected to the wire 204 formed on the one surface via through holes 221.

Since the intermediate portions 204x and 204y of the two wires 204 are formed on the different surfaces of the holding portion 32, they do not electrically interfere with each other at the edge portion of the holding portion 32.

When the holding portion 32 is stamped out from the base member 201 by presswork, whether to cut the intermediate portions 204x and 204y of the two wires 204 can be selected by selecting whether to stamp out semicircular portions X and Y shown in FIG. 21 formed in the edge portion of the holding portion 32.

More specifically, as shown in FIG. 22A, if neither the portion X nor Y is stamped out, neither of the two wires 204 is cut. If the portion X or Y is stamped out, the intermediate portion 204x or 204y of the two wires 204 is cut by an X recess 250 or a Y recess 260 opened at an edge of the holding portion 32. Further, if both the portions X and Y are stamped out, the intermediate portions 204x and 204y of the two wires 204 are cut by the X recess 250 and the Y recess 260.

The intermediate portions of the two wires 204 are located in the edge portion of the holding portion 32 as described above. Therefore, to realize the aforementioned selection, it is only necessary to slightly change the shape of the mold for use in the presswork for stamping out the holding portion 32 from the base member 201 so as to stamp out the X recess 250 or the Y recess 260 or both.

Thus, the X recess 250 and the Y recess 260 can be selectively formed in the edge portion of the holding portion 32 at the same time as stamping out the holding portion 32 without using a complex mold.

Figure 24A:
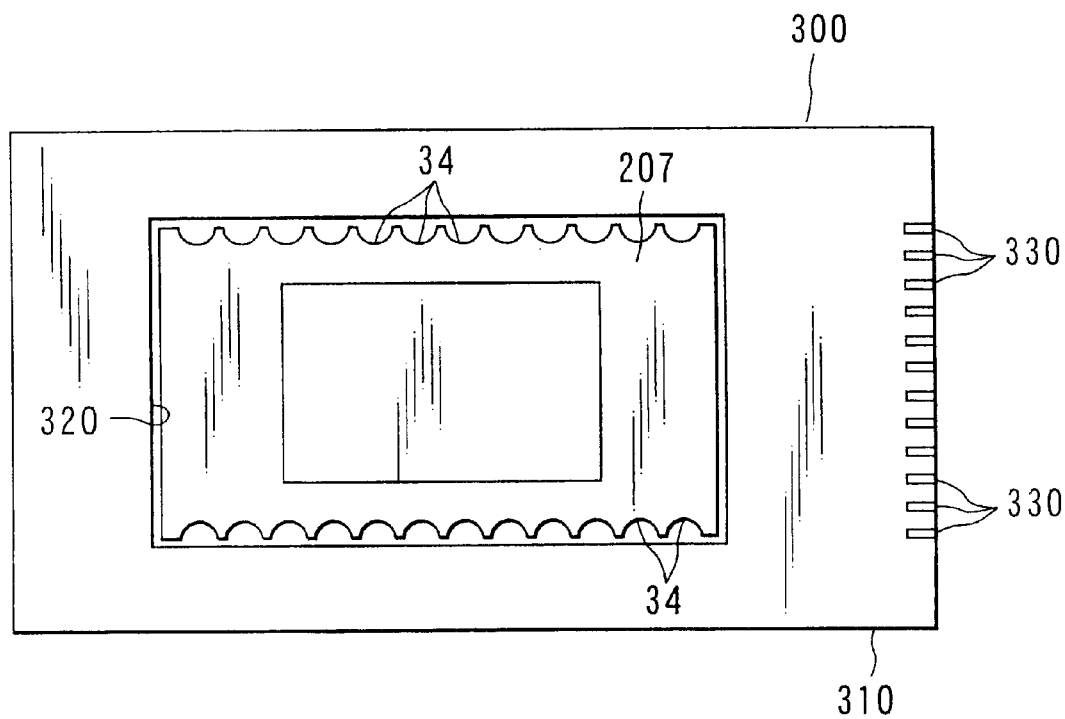
FIG. 24A is a plan view showing a semiconductor memory device on which a semiconductor module is mounted.
Figure 24B:
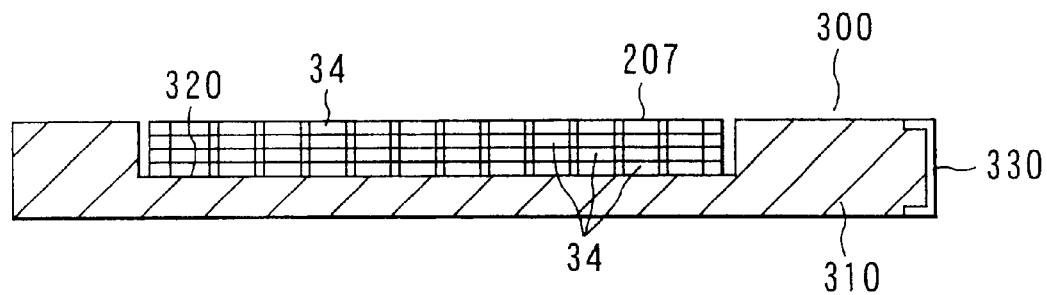
FIG. 24B is a cross-sectional view of the semiconductor memory device shown in FIG. 24A.

The four TCPs 31D formed as described above are stacked and integrated as shown in FIG. 22B, so that the stacked-type semiconductor unit 207 is formed. As shown in FIGS. 24A and 24B, the stacked-type semiconductor unit 207 is mounted on and fixed to a concave 320 formed in a substrate 310 for forming a semiconductor memory medium 300. The electrodes 34 of the stacked-type semiconductor unit 207 are electrically connected to terminals 330 formed on the substrate 310, with the result that the semiconductor memory device 300 is completed. Although not shown in the drawing, the stacked-type semiconductor unit 207 mounted on the substrate 310 is sealed with resin.

As described above, to select a specific one of the semiconductor chips 36 to be accessed from an external device, the intermediate portions 204x and 204y of the two wires 204 connected to the two electrodes 34x and 34y are formed in the edge portion of the holding portion 32 stamped out from the base member 201.

Therefore, at least one of the intermediate portions 204x and 204y of the two wires 204 can be cut at the same time as stamping out the holding portion 32. Consequently, the productivity can be improved as compared to the case in which the wires 204 are cut in another process.

Further, since the wires 204 are cut by forming the X recess 250 and the Y recess 260, stamped out portions for forming the recesses (denoted by a numeral 350 in FIG. 23B) remain integral with the base member 201.

Thus, since no cuttings are produced by forming the recesses 250 and 260, unlike in the conventional art in which a circular portion a wiring board is stamped out to cut a wire, disposal of cuttings is not required after the presswork.

As shown in FIG. 21, the intermediate portions 204x and 204y of the two wires 204 to be cut are formed on the different surfaces of the holding portion 32. Therefore, the intermediate portions 204x and 204y can be successfully formed on the edge portion of the holding portion 32, such that when either the intermediate portion 204x or 204y is cut, the other intermediate portion is not cut.

If the stacked-type semiconductor unit 207 comprises five or more stacked TCPs 31D, three or more chip selecting electrodes are required. Accordingly, three or more wires for connecting the electrodes to the semiconductor chip must be provided. In this case, the intermediate portions of such wires may be formed not only in one edge portion of the holding portion but also in another edge portion, so that the intermediate portions of the wires can be cut at the same time as stamping out of the holding portions 32.

In the thirteenth embodiment, the TCP having wiring boards made of resin film is used as the semiconductor device. However, the material of wiring boards is not limited to resin film. The present invention can be applied to wiring boards made of any material that can be press-worked.

FIGS. 25A to 27 show a fourteenth embodiment of the present invention. The purpose of this embodiment is to provide the stacked structure with a heat radiating effect, thereby suppressing a malfunction, which may occur when the temperature of the package is increased. FIGS. 25A to 25C show a method for manufacturing a wiring board 401 of this embodiment. Referring to FIG. 25A, the wiring board 401 has a holding portion made of a synthetic resin sheet, which is elastic and electrically insulating, for example, a 25 $\mu$m-thick polyimid sheet. A wiring pattern 402, made of copper or the like, and connecting lands 403 for external connection are formed on the wiring board 401. The wiring pattern 402 has a thickness of, for example, 12 $\mu$m. The connecting land 403 has a diameter of, for example, 500 $\mu$m. A pair of connecting lands 403 are formed on the corresponding portions of both surfaces of the wiring board 401, and electrically connected to each other through a through hole 404. A metal film 405 made of copper or the like, having a thickness of, for example, 18 $\mu$m, is formed on the opposite side of the wiring board 401 from the wiring pattern 402. A pair of connecting terminals 406 for external connection, having a diameter of, for example, 1 mm, are formed on the corresponding portions of both surfaces of the wiring board 401, and electrically connected to each other through a through hole 407.

Then, only the connecting lands 403 and the connecting terminals 406 are plated with copper to a thickness of, for example, 20–40 $\mu$m. Thereafter, the connecting lands 403 and the connecting terminals 406 are plated with nickel. Further, solder layers 408 of a thickness of 10–20 $\mu$m are formed on the connecting lands 403 and the connecting terminals 406 by plating.

As shown in FIG. 25B, a semiconductor chip 409 is mounted on a desired portion of the wiring pattern of the wiring board formed in the manner as described above. The semiconductor chip 409, which has a thickness of, for example, 50 μm, is connected to the wiring pattern 402 via bumps 409a made of gold or the like having a height of 10–30 μm. The 50 μm-thick semiconductor chip is considerably thinner than the conventional chip and has a flexibility of being able to bend.

The semiconductor chip 409 is flip-chip bonded as follows. An anisotropic conductive material 410, made of resin in which conductive particles are dispersed, is interposed between the wiring board 401 and the semiconductor chip 409, and crimped at a temperature of, for example, 180° C. As a result, the semiconductor chip 409 is electrically connected to the wiring pattern 402 and the surface of the semiconductor chip 409 facing the wiring board 401 and the peripheral surface thereof are sealed with resin.

A plurality of, in this embodiment, four wiring boards 401 manufactured in the manner described above are stacked on a base board 411 as shown in FIG. 26 by the procedures as will be described below. The base board 411 is made of an electrically insulating material, such as glass epoxy resin. Connecting lands 412, which are made of metal, such as copper, and serve as base electrodes, are formed on both end portions of the upper surface of the base board 411. The connecting lands 412 are electrically connected to a wiring pattern 413 formed on the lower surface of the base board 411 via through holes (not shown). The four wiring board 401 are mounted on the base board 411 by means of a mount tool (not shown). The four wiring boards 401 supplied on the base board 411 are aligned such that the respective connecting lands 403 and connecting terminals 406 lie on top of one another along the vertical direction. For example, highly heat-conductive paste 415 is interposed between the wiring boards 401. As a result, the rear surface of the chip 409 is thermally connected to the metal film 405. Even if the highly heat-conductive paste 415 is not interposed, no problem will occur so long as the rear surface of the chip 409 and the metal film 405 are thermally connected.

The portions of the connecting lands 403 and the connecting terminals 406 of the stacked wiring boards 401 are pressurized and heated by a heater tool (not shown). Since the connecting lands 403 and the connecting terminals 406 are pressurized, the wiring boards 401 are brought into contact. As a result, the heat of the heater tool is transmitted to the solder layers 408 through the connecting lands 403 and the contact terminals 406. Therefore, the solder layers 408 are melted to form a ball, thereby electrically connecting the connecting lands 403 and fixing the connecting terminals 406 thermally connected.

Figure 27:
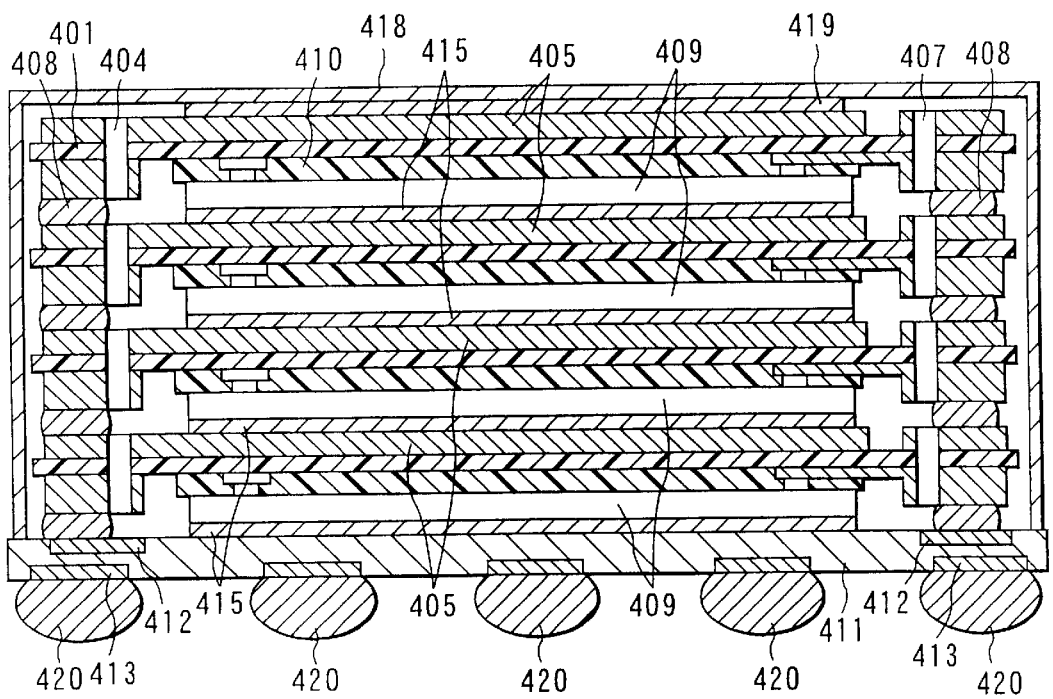
FIG. 27 is a cross-sectional view showing a schematic structure of a stacked-type semiconductor unit covered by a metal cap.

Then, as shown in FIG. 27, the stacked semiconductor packages are sealed by, for example, a metal cap 418. At this time, the metal cap 418 is thermally connected to the metal film 405 of the uppermost package through, for example, highly heat-conductive paste 419.

After the sealing, solder balls serving as connecting members, having a diameter of, for example, 0.1–0.5 mm, are adhered by flux or the like to the wiring pattern 413 for external connection formed on the lower surface of the base board 411. Then, the solder balls are melted in the reflowing furnace, so that solder ball bumps 420 of a height of about 0.05–0.5 mm are fixed to the wiring pattern 413.

The solder balls are not necessarily provided on the wiring pattern on the lower surface of the base board. Instead, they can be provided on a connecting wire of a circuit board on which the semiconductor device is mounted.

In the stacked structure of the above semiconductor packages, the semiconductor element-mounting portion is 80–100 μm thick, and the gap between the wiring boards is 100–160 μm thick. Thus, the semiconductor packages are stacked such that each semiconductor element 409 is contained in the gap between the wiring boards 401.

With the above structure, the semiconductor chips 409 are thermally connected to the metal cap 418. Therefore, since the heat generated from the semiconductor chips 409 is radiated externally through the metal cap 418, a malfunction due to heat can be prevented.

Figure 28:
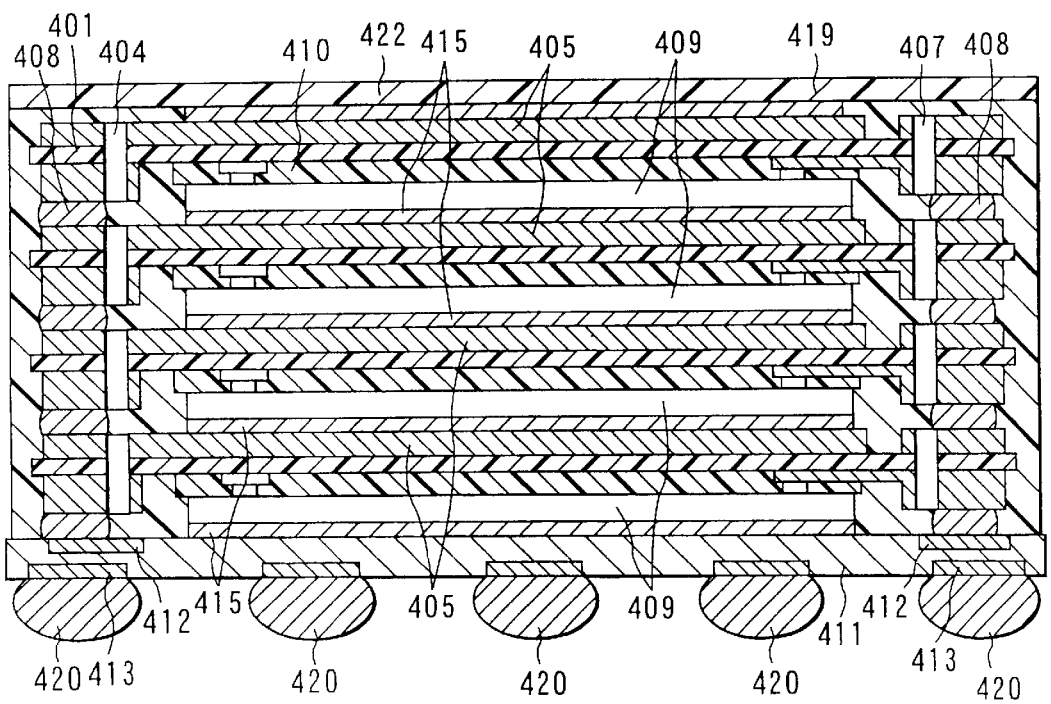
FIG. 28 is a cross-sectional view showing a schematic structure of a stacked-type semiconductor unit according to a fifteenth embodiment of the present invention.
Figure 29:
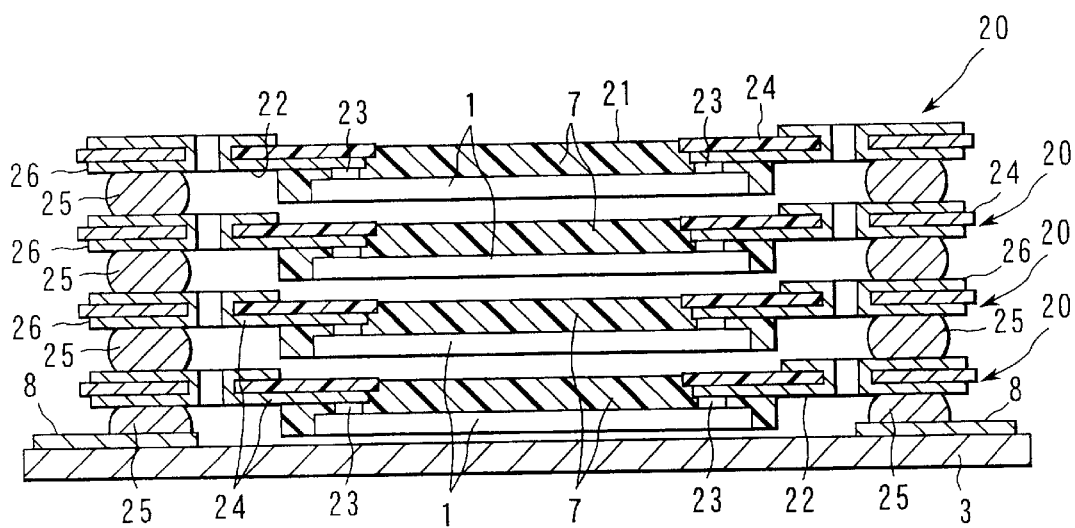
FIG. 29 is a cross-sectional view showing a schematic structure of a conventional stacked-type semiconductor unit.

FIG. 28 shows a fifteenth embodiment of the present invention, modified from the fourteenth embodiment. In this embodiment, the semiconductor packages stacked as in the fourteenth embodiment are sealed with epoxy resin 421 or the like. After the sealing, a cooling plate 422 is attached to the uppermost metal film, thereby improving the cooling efficiency.

According to the fourteenth and fifteenth embodiments, the heat generated from the semiconductor elements can be radiated efficiently. As a result, a malfunction of the semiconductor elements due to a rise in temperature can be prevented.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a semiconductor chip having flexibility to bend and including an internal electrode;

a wiring board having flexibility to bend and including a wiring pattern electrically connected to the internal electrode of the semiconductor chip, said wiring board having a recess opened at an end face of a peripheral portion of the wiring board; and an external electrode provided on the recess and electrically connected to the wiring pattern.

2. A stacked-type semiconductor unit comprising:

a semiconductor chip having flexibility to bend and including an internal electrode;

a plurality of wiring boards having flexibility to bend and each including a wiring pattern electrically connected to the internal electrode of the semiconductor chip, each wiring board having a recess opened at an end face of a peripheral portion of the wiring board;

an external electrode provided on the recess and electrically connected to the wiring pattern;

a base board having a base electrode; and fillet solder electrically connecting and fixing the external electrode connected to the wiring pattern of each wiring board to the base electrode, in a state where said plurality of wiring boards are stacked on the base electrode formed on the base board such that external electrodes are aligned.

3. A stacked-type semiconductor unit according to claim 2, wherein the external electrode of the wiring board is provided on one surface of the wiring board.

4. A stacked-type semiconductor unit according to claim 2, wherein the wiring board has a recess opened at an end face of the end portion of the wiring board, and the external electrode of the wiring board has a portion covering the recess.

5. A stacked-type semiconductor unit according to claim 1 wherein the portion of the external electrode covering the recess has a through hole.

6. A stacked-type semiconductor unit according to claim 2, wherein said plurality of semiconductor devices are stacked such that an upper-positioned semiconductor device extends over a lower-positioned semiconductor device.

7. A stacked-type semiconductor unit comprising:
a plurality of wiring boards having flexibility to bend, each including a semiconductor chip having flexibility to bend;
a plurality of wires formed on the wiring boards, first ends of said plurality of wires being connected to the semiconductor chip;
a plurality of electrodes formed on the wiring boards and connected to second ends of said plurality of wires;
a plurality of chip selecting terminals provided on the wiring boards, for specifying the semiconductor chip depending on whether a wire connected to the semiconductor chip is cut; and
a plurality of cut portions, each opened at a periphery of the wiring board, for cutting the wire connecting the chip selecting terminal and the semiconductor chip.

8. A stacked-type semiconductor unit according to claim 7, wherein each semiconductor device has a plurality of chip selecting terminals, and at least parts of the respective wires connecting said plurality of chip selecting terminals and the semiconductor chip are formed on different surfaces of a peripheral portion the wiring board.

9. A stacked-type semiconductor unit according to claim 7, wherein the cut portion is formed simultaneously with stamping out of the wiring board.

* * * * *